United States Patent
Ma

(10) Patent No.: US 9,853,220 B2
(45) Date of Patent: Dec. 26, 2017

(54) EFFICIENT ORGANIC LIGHT-EMITTING DIODES AND FABRICATION OF THE SAME

(75) Inventor: Liping Ma, San Diego, CA (US)

(73) Assignee: Nitto Denko Corporation, Osaka (JP)

( * ) Notice: Subject to any disclaimer, the term of this patent is extended or adjusted under 35 U.S.C. 154(b) by 960 days.

(21) Appl. No.: 14/344,300

(22) PCT Filed: Sep. 11, 2012

(86) PCT No.: PCT/US2012/054664
§ 371 (c)(1),
(2), (4) Date: Oct. 24, 2014

(87) PCT Pub. No.: WO2013/039914
PCT Pub. Date: Mar. 21, 2013

(65) Prior Publication Data
US 2015/0041780 A1    Feb. 12, 2015

Related U.S. Application Data

(60) Provisional application No. 61/533,679, filed on Sep. 12, 2011.

(51) Int. Cl.
| | | |
|---|---|---|
| H01L 51/00 | (2006.01) | |
| H01L 51/50 | (2006.01) | |
| H01L 51/52 | (2006.01) | |
| C09B 57/00 | (2006.01) | |

(52) U.S. Cl.
CPC .......... *H01L 51/0052* (2013.01); *C09B 57/00* (2013.01); *C09B 57/008* (2013.01); *H01L 51/006* (2013.01); *H01L 51/0061* (2013.01); *H01L 51/0067* (2013.01); *H01L 51/0071* (2013.01); *H01L 51/0072* (2013.01); *H01L 51/0085* (2013.01); *H01L 51/504* (2013.01); *H01L 51/506* (2013.01); *H01L 51/5044* (2013.01); *H01L 51/5064* (2013.01); *H01L 51/5068* (2013.01); *H01L 51/5092* (2013.01); *H01L 51/5218* (2013.01); *H01L 51/5265* (2013.01); *H01L 51/5268* (2013.01); *H01L 51/5278* (2013.01); *H01L 51/0059* (2013.01); *H01L 51/0069* (2013.01); *H01L 2251/5376* (2013.01)

(58) Field of Classification Search
CPC .................. C09B 57/00; C09B 57/008; H01L 2251/5376; H01L 51/0052; H01L 51/0059; H01L 51/006; H01L 51/0061; H01L 51/0067; H01L 51/0069; H01L 51/0071; H01L 51/0072; H01L 51/0085; H01L 51/504; H01L 51/5044; H01L 51/506; H01L 51/5064; H01L 51/5068; H01L 51/5092; H01L 51/5218; H01L 51/5265; H01L 51/5268; H01L 51/5278
See application file for complete search history.

(56) References Cited

U.S. PATENT DOCUMENTS

| | | | |
|---|---|---|---|
| 6,984,934 B2 | 1/2006 | Möller et al. | |
| 7,053,547 B2 | 5/2006 | Lu et al. | |
| 7,109,652 B2 | 9/2006 | Tsai et al. | |
| 7,345,300 B2 | 3/2008 | Qin et al. | |
| 7,816,021 B2 | 10/2010 | Kim et al. | |
| 7,867,631 B2 | 1/2011 | Kim et al. | |
| 8,604,689 B2 | 12/2013 | Ma et al. | |
| 9,051,284 B2 | 6/2015 | Zheng et al. | |
| 9,328,086 B2 | 5/2016 | Sisk et al. | |
| 2002/0192441 A1 | 12/2002 | Kalkan et al. | |
| 2005/0156520 A1 | 7/2005 | Tanaka et al. | |
| 2006/0186802 A1 | 8/2006 | Cok et al. | |
| 2006/0220518 A1 | 10/2006 | Greiner | |
| 2006/0232194 A1 | 10/2006 | Tung et al. | |
| 2006/0286403 A1 | 12/2006 | Lee | |
| 2008/0102310 A1 | 5/2008 | Thompson et al. | |
| 2008/0157665 A1 | 7/2008 | Wu et al. | |
| 2008/0258606 A1 | 10/2008 | Butler et al. | |
| 2008/0278067 A1 | 11/2008 | Tyan et al. | |
| 2008/0297029 A1 | 12/2008 | Cok | |
| 2009/0033212 A1 | 2/2009 | Ahn et al. | |
| 2009/0039294 A1 | 2/2009 | Choong et al. | |

(Continued)

FOREIGN PATENT DOCUMENTS

| | | |
|---|---|---|
| CN | 1 498 046 | 5/2004 |
| CN | 1 711 651 | 12/2005 |

(Continued)

OTHER PUBLICATIONS

D'Andrade et al., "High-Efficiency Yellow Double-Doped Organic Light-Emitting Devices Based on Phosphor-Sensitized Fluorescence," Applied Physics Letters, 2001, vol. 79, pp. 1045-1047.
Gustafsson et al. "Flexible Light-Emitting Diodes Made from Soluble Conducting Polymer," Nature, Jun. 11, 1992, vol. 357, pp. 477-479.
Hsiao et al., "Emitting Layer Thickness Dependence of Color Stability in Phosphorescent Organic Light-Emitting Devices," Organic Electronics, 2010, vol. 11, No. 9, pp. 1500-1506.
International Search Report and Written Opinion in PCT Application No. PCT/US2012/054664, dated Dec. 18, 2012.
International Preliminary Report on Patentability in PCT Application No. PCT/US2012/054664, dated Mar. 12, 2014.
Kanno et al., "High-Efficiency Top-Emission White-Light-Emitting Organic Electrophosphorescent Devices," Applied Physics Letters, 2005, vol. 86, 263502.

(Continued)

*Primary Examiner* — Erich A Leeser
(74) *Attorney, Agent, or Firm* — Knobbe, Martens, Olson & Bear, LLP

(57) ABSTRACT

Light-emitting devices comprising light-emitting diodes are described herein. These devices may include a substrate, a reflective anode, a hole-injection layer, a hole-transport layer, an emissive component, an electron-transport layer, a cathode, an enhancement layer, and a light-scattering layer. The emissive component may include first and second fluorescent light-emitting layers with an intervening phosphorescent light-emitting layer or first and second phosphorescent light-emitting layers with an intervening fluorescent light-emitting layer.

21 Claims, 7 Drawing Sheets

(56) References Cited

U.S. PATENT DOCUMENTS

| | | |
|---|---|---|
| 2009/0091255 A1 | 4/2009 | Lee et al. |
| 2009/0115319 A1 | 5/2009 | Kim et al. |
| 2009/0174308 A1 | 7/2009 | Yamazaki et al. |
| 2009/0212694 A1 | 8/2009 | Cok |
| 2009/0224660 A1 | 9/2009 | Nakanishi et al. |
| 2009/0236974 A1 | 9/2009 | Tamaru et al. |
| 2010/0051968 A1 | 3/2010 | Seo et al. |
| 2010/0052527 A1 | 3/2010 | Ikeda et al. |
| 2010/0078631 A1 | 4/2010 | Pieh |
| 2010/0159792 A1 | 6/2010 | Visser et al. |
| 2010/0213452 A1 | 8/2010 | Sisk et al. |
| 2010/0326526 A1 | 12/2010 | Zheng |
| 2011/0156059 A1 | 6/2011 | Reineke et al. |
| 2012/0223635 A1 | 9/2012 | Mochizuki et al. |
| 2015/0228907 A1 | 8/2015 | Ma |

FOREIGN PATENT DOCUMENTS

| | | | | |
|---|---|---|---|---|
| CN | 101 274 916 | | 10/2008 | |
| EP | 2 166 589 | * | 3/2010 | ............ H01L 51/50 |
| JP | 2003-195775 | | 7/2003 | |
| JP | 2005-235753 | | 9/2005 | |
| JP | 2006-505909 | | 2/2006 | |
| JP | 2012-532135 | | 12/2012 | |
| TW | I284009 | | 7/2007 | |
| WO | WO 2004/049465 | | 6/2004 | |
| WO | WO 2006/009039 | | 1/2006 | |
| WO | WO 2006/035596 | * | 4/2006 | ............ H05B 33/02 |
| WO | WO 2006/112265 | | 10/2006 | |
| WO | WO 2006/130883 | * | 12/2006 | |
| WO | WO 2008/131750 | | 11/2008 | |
| WO | WO 2009/009695 | | 1/2009 | |
| WO | WO 2010/016990 | | 2/2010 | |
| WO | WO 2010/024572 | | 3/2010 | |
| WO | WO 2011/008560 | | 1/2011 | |
| WO | WO 2012/064987 | | 5/2012 | |
| WO | WO 2012/119111 | | 9/2012 | |
| WO | WO 2013/039914 | | 3/2013 | |

OTHER PUBLICATIONS

Liu et al., "Microcavity Top-Emitting Organic Light-Emitting Devices Integrated with Diffusers for Simultaneous Enhancement of Efficiencies and Viewing Characteristics," Applied Physics Letters, 2009, vol. 94, 103302.

Pieh et al., "Two-Stacked White Organic Light-Emitting Diodes Consisting of Fluorescent and Phosphorescent Hybrd Structure with High Efficiency and Good Colo Characteristics," SID 09 Digest, 2009, pp. 903-906.

Riel et al., "Tuning the Emission Characteristics of Top-Emitting Organic Light-Emitting Devices by Means of a Dielectric Capping Layer: An Experimental and Theoretical Study," Journal of Applied Physics, Oct. 15, 2003, vol. 94, No. 8, pp. 5290-5296.

Schwartz et al., "Harvesting Triplet Excitons from Fluorescent Blue Emitters in White Organic Light-Emitting Diodes," Advanced Materials, 2007, vol. 19, pp. 3672-3676.

Su et al., "Enhanced Light Out-Coupling of Organic Light-Emitting Devices Using Embedded Low-Index Grids," Nature Photonics, 2008, vol. 2, pp. 483-487.

Tyan, et al., "*Invited Paper*:Tandem Hybrid White OLED Devices with Improved Light Extraction," SID 09 Digest, 2009, pp. 895-898.

Wang et al., "Harvesting Excitons via two Parallel Channels for Efficient White Organic LEDs with Nearly 100% Internal Quantum Efficiency: Fabrication and Emission-Mechanism Analysis," Advanced Functional Materials, 2009, vol. 19, No. 1, pp. 84-95.

Birnstock et al., "Highly Efficient White Top-Emission PIN OLEDs for Display and Lighting," SID Symposium Digest of Technical Papers, May 2010, vol. 41, No. 1, pp. 774-777.

* cited by examiner

EFFICIENT ORGANIC LIGHT-EMITTING DIODES AND FABRICATION OF THE SAME

CROSS REFERENCE TO RELATED APPLICATION

This application is a national phase application under 35 U.S.C. §371 of International Application No. PCT/US2012/054664, filed Sep. 11, 2012, which claims priority to U.S. Provisional Patent Application No. 61/533,679, filed on Sep. 12, 2011, both of which are hereby incorporated by reference in their entirety.

BACKGROUND OF THE INVENTION

Field of the Invention

The embodiments include light-emitting devices, methods of fabricating the devices, and uses thereof.

Description of the Related Art

White organic light-emitting devices (WOLEDs) are promising candidates as replacements for fluorescent tubes and incandescent bulbs to save energy. However, there is room for improvement in current WOLED technology. For example, the power efficiency of WOLEDs may be improved in order to provide even greater energy savings. Additionally, the useful lifetimes of currently available devices have room for improvement.

SUMMARY OF THE INVENTION

In some embodiments, the devices described herein include organic light-emitting devices, such as white organic light-emitting devices, that have improved efficiency and/or a longer useful lifetime. In an embodiment, the light-emitting device comprises a substrate, a reflective anode over the substrate, a hole-injection layer over the reflective anode, a hole-transport layer over the hole-injection layer, and an emissive component over the hole-transport layer. In an embodiment, the emissive component comprises a first fluorescent light-emitting layer, a second fluorescent light-emitting layer, and an intervening phosphorescent light-emitting layer disposed between the first fluorescent light-emitting layer and the second fluorescent light-emitting layer. In an embodiment, the emissive component comprises a first phosphorescent light-emitting layer, a second phosphorescent light-emitting layer, and an intervening fluorescent light-emitting layer disposed between the first phosphorescent light-emitting layer and the second phosphorescent light-emitting layer. In an embodiment, the light-emitting device comprises an electron-transport layer over the emissive component, a semi-transparent or transparent cathode over the electron-transport layer, an enhancement layer over the semi-transparent or transparent cathode, and a light-scattering layer over the enhancement layer.

These and other embodiments are described in greater detail below.

DETAILED DESCRIPTION OF THE PREFERRED EMBODIMENTS

Figure 1A:
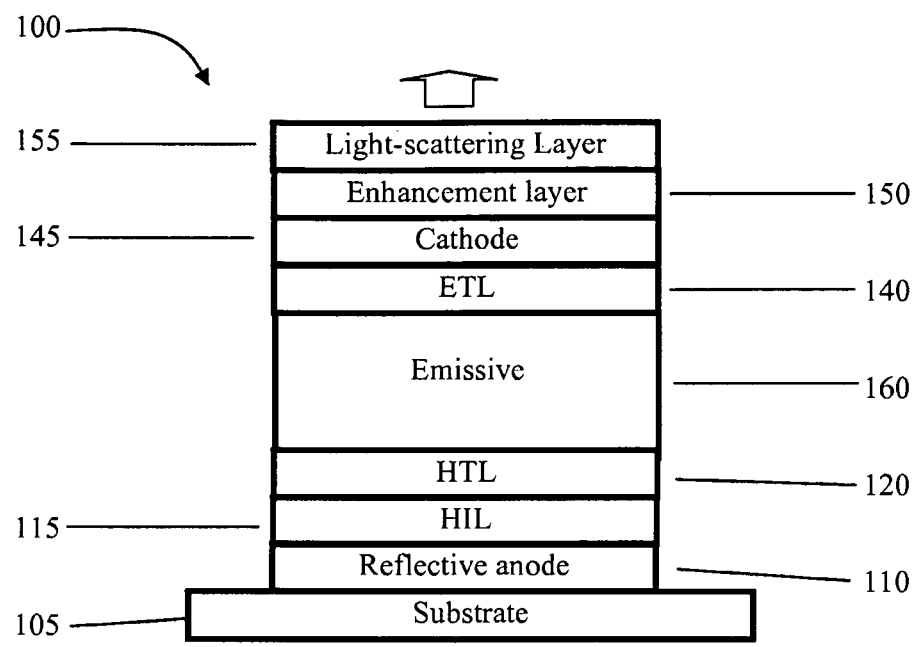
FIGS. 1A-F are schematic depictions of some embodiments of a light-emitting device.
Figure 1B:
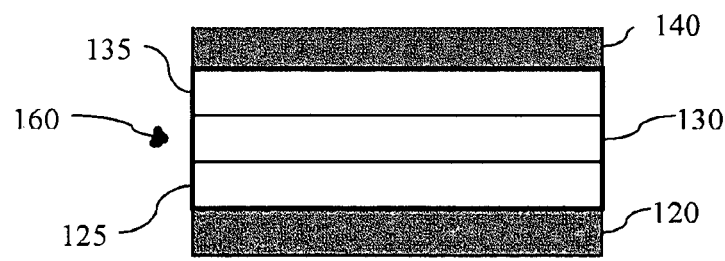
Figure 1C:
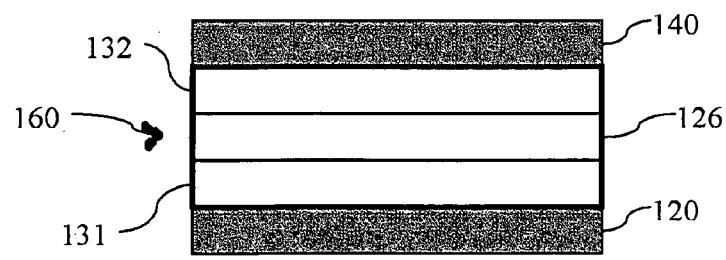

Some embodiments of top-emitting white organic light emitting diode (WOLED) devices with improved power efficiency are described herein. FIG. 1A depicts an example of a light-emitting device 100. In some embodiments, the light emitting device 100 is a top-emitting WOLED, which emits light from the cathode side. The device comprises a substrate 105, a reflective anode 110 over the substrate, a hole-injection layer (HIL) 115 over the reflective anode 110, a hole-transport layer (HTL) 120 over the HIL 115, an emissive component 160 over the HTL 120, an electron-transport layer (ETL) 140 over the emissive component 160, a cathode 145 over the ETL 140, an enhancement layer 150 over the cathode 145, and a light-scattering layer 155 over the enhancement layer 150. The emissive component 160 may include sublayers, e.g., as illustrated in FIG. 1B-C. For example, in some embodiments, the emissive component 160 comprises a first fluorescent light-emitting layer 125, a second fluorescent light-emitting layer 135, and an intervening phosphorescent light-emitting layer 130 disposed between the first fluorescent light-emitting layer 125 and the second fluorescent light-emitting layer 135 (see FIG. 1B). In an embodiment, at least a portion of the first fluorescent light-emitting layer and at least a portion of the intervening phosphorescent light-emitting layer directly contact one another. In an embodiment, at least a portion of the second fluorescent light-emitting layer and at least a portion of the intervening phosphorescent light-emitting layer directly contact one another.

In some embodiments, the emissive component 160 comprises a first phosphorescent light-emitting layer 131 and a second phosphorescent light-emitting layer 132, and an intervening fluorescent light-emitting layer 126 disposed between the first and the second phosphorescent light-emitting layers (see FIG. 1C). In an embodiment, at least a portion of the first phosphorescent light-emitting layer and at least a portion of the intervening fluorescent light-emitting layer directly contact one another. In an embodiment, at least a portion of the second phosphorescent light-emitting layer and at least a portion of the intervening fluorescent light-emitting layer directly contact one another.

In some embodiments, the intervening phosphorescent light-emitting layer is disposed on the first fluorescent light-emitting layer, and the second fluorescent light-emitting layer is disposed on the intervening phosphorescent light-emitting layer. In some embodiments, the intervening fluorescent light-emitting layer is disposed on the first phosphorescent light-emitting layer, and the second phosphorescent light-emitting layer is disposed on the intervening fluorescent light-emitting layer. As shown in FIG. 1A, the anode 110 may be disposed on the substrate 105 so that the two layers 105/110 have some direct contact. Alternatively, other layers may be present between the substrate 105 and the reflective anode 110. For example, an adhesive layer (not illustrated in FIG. 1) comprising a material such as an epoxy may be between the substrate 105 and the anode 110. The hole-transport layer 120 may be disposed on the hole-injection layer 115 so that the two layers have some direct contact. Alternatively, one or more layers comprising one or more materials such as hole-transport material, hole-injection material, etc., may be present between the two layers 115/120.

The emissive component 160 may be disposed on the hole-transport layer 120 so that the two layers have some direct contact. Alternatively, one or more layers comprising one or more materials such as hole-transport material, exciton-blocking material, electron blocking-material, etc., may be present between the two layers 120/160.

The electron-transport layer 140 may be disposed on the emissive component 160 so that the two layers have some direct contact. In some embodiments, one or more layers comprising one or more materials such as electron-transport material, exciton-blocking material, hole-blocking material, etc., may be present between the two layers.

The cathode 145 may be disposed on the electron-transport layer 140 so that the two layers 140/145 have some direct contact. Alternatively, one or more layers comprising one or more materials such as electron-transport material, electron-injection material, etc., may be present between the two layers 140/145.

The light-scattering layer 155 may be disposed on the enhancement layer 150 so that the two layers 150/155 have some direct contact. Alternatively, one or more layers comprising a transparent material or a filling material may be present between the two layers 150/155. For example, a filling material may comprise a transparent polymer such as an epoxy or a transparent inorganic material.

The substrate 105 may comprise any suitable material, including (rigid or flexible) glass, metal sheet, organic polymer plastic, inorganic materials, ceramics, etc., or combinations thereof. A substrate may be transparent or opaque. For example the substrate may not allow light to pass through it, or may alternatively have a percent transmittance of about 10%, about 50%, about 80%, about 90%, about 99%, or any percent transmittance in a range bounded by, or between, any of these values. In some embodiments, the substrate may have a transmittance in the range of about 10% to about 99%, about 50% to about 99%, or about 10% to about 50%.

An anode layer e.g., the anode layer 110, typically comprises a conductive material such as a metal, a mixed metal, an alloy, a metal oxide or a mixed-metal oxide, a conductive polymer, and/or a material such as a carbon nanotube (CNT). Examples of suitable metals include the Group 1 metals, the metals in Groups 4, 5, 6, and the Group 8-10 transition metals. If the anode layer is to be light-transmitting, metals in Group 10 and 11, such as Au, Pt, and Ag, or alloys thereof; or mixed-metal oxides of Group 12, 13, and 14 metals, such as indium-tin-oxide (ITO), indium-zinc-oxide (IZO), and the like, may be used. In some embodiments, the anode layer may be an organic material such as polyaniline. The use of polyaniline is described in "Flexible light-emitting diodes made from soluble conducting polymer," Nature, vol. 357, pp. 477-479 (11 Jun. 1992). Examples of suitable high work function metals and metal oxides include but are not limited to Au, Pt, or alloys thereof; ITO; IZO; and the like. In some embodiments, the anode layer can have a thickness in the range of about 1 nm to about 1000 nm, about 50 nm to 500 nm, or about 50 nm to about 300 nm.

Figure 1D:
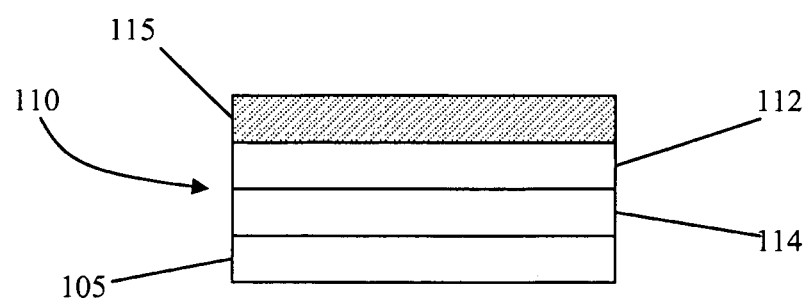

In some embodiments, an anode, e.g., the anode layer 110, may be a reflective anode, which may include any anode that reflects at least a portion of light that encounters the surface of the anode. In some embodiments, the anode reflects at least about 80%, at least about 90%, at least about 95%, or at least about 99% of light that encounters the surface of the anode, and the amount of light reflected may approach 100% of light that encounters the surface. In some embodiments, the anode 110 may be a combination of sublayers. For example, as shown in FIG. 1D, the anode 110 may comprise a first anode sublayer 114 and a second anode sublayer 112. The second anode sublayer 112 may be disposed on the first anode sublayer 114 so that the two sublayers have some direct contact. Another layer of the device, such as a hole-injection layer 115 may be in contact with the second anode sublayer 112.

The first anode sublayer 114 may comprise Al, Ag, Ni, or a combination thereof. The thickness of a first anode sublayer may vary. For example, a first anode sublayer may have thickness of about 10 nm, about 50 nm, about 70 nm, about 100 nm, or any thickness in a range defined by, or between, any of these values. In some embodiments, a first anode sublayer may have a thickness in a range of about 10 nm to about 100 nm, about 10 nm to about 70 nm, or about 50 nm to about 100 nm.

The second anode sublayer 112 may comprise Al, Ag, Au, or a combination thereof. The thickness of a second anode sublayer may also vary. For example, a second anode sublayer may have a thickness of about 25 nm, about 50 nm, to about 200 nm, or any thickness in a range defined by, or between, any of these values. In some embodiments, a second anode sublayer may have a thickness in a range of about 5 nm to about 200 nm, about 10 nm to about 100 nm, or about 30 nm to about 70 nm.

In some embodiments, the first anode sublayer may comprise Ag and/or the second anode sublayer may comprise Al.

A cathode, e.g., the cathode 145, may be a layer including a material having a lower work function than the anode layer. Examples of suitable materials for the cathode layer include those selected from alkali metals of Group 1, Group 2 metals, Group 12 metals including rare earth elements, lanthanides and actinides, materials such as aluminum, indium, calcium, barium, samarium and magnesium, and combinations thereof. Li-containing organometallic compounds, LiF, and $Li_2O$ may also be deposited between an electron-transport layer and the cathode layer to lower the operating voltage. In some embodiments a cathode may comprise Al, Ag, Mg, Ca, Cu, Mg/Ag, LiF/Al, CsF, CsF/Al or alloys thereof, indium tin oxide (ITO), Al:ZnO, or transparent and conducting carbon materials such as carbon nano-tubes (CNT) or graphene. In some embodiments, the cathode layer can have a thickness in the range of about 1 nm to about 1000 nm. In some embodiments, a cathode layer comprising a metal may have a thickness of: at least about 1 nm, about 5 nm, or about 10 nm; and/or up to about 30 nm, about 50 nm, or about 100 nm. In some embodiments, a cathode layer comprising a transparent material such as a metal oxide may have a thickness of: at least about 50 nm, about 100 nm, about 200 nm, and/or up to about 500 nm, about 800 nm, or about 1000 nm.

Figure 1E:
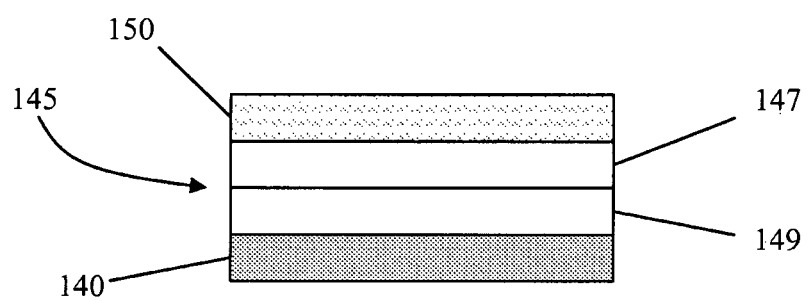

The cathode may be transparent or semi-transparent. A transparent cathode may include a cathode through which most light passes. A semi-transparent cathode may include a cathode that is not transparent, but through which some light may pass. In some embodiments, a cathode may have a relative transmittance of: at least about 50%, at least about 60%, at least about 80%, or at least about 90%, and may approach 100%. In some embodiments, the cathode 145 may be a combination of sublayers. For example, as shown in FIG. 1E, such a cathode may comprise a first cathode sublayer 149 and a second cathode sublayer 147. In some embodiments, the first cathode sublayer 149 may be disposed on an electron transport layer 140. In some embodiments, an enhancement layer 150 may be disposed on the second cathode sublayer 147.

The first cathode sublayer may comprise alkali metals of Group 1, Group 2 metals, Group 12 metals including rare earth elements, lanthanides and actinides, materials such as aluminum, indium, calcium, barium, samarium and magnesium, and combinations thereof. In some embodiments, the first cathode sublayer comprises Mg, Ca, Mg/Ag, LiF/Al, CsF, CsF/Al or alloys thereof.

The thickness of a first cathode sublayer may vary. For example, a first cathode sublayer may have thickness of about 0.1 nm, about 1 nm, about 2 nm, about 4 nm, about 5 nm, about 6 nm, about 10 nm, about 12 nm, about 20 nm, about 50 nm, or any thickness in a range defined by, or between, any of these values. In some embodiments, the first cathode sublayer may have a thickness in a range of about 0.1 nm to about 50 nm, about 1 nm to about 20 nm, about 2 nm to about 10 nm, or about 4 nm.

The second cathode sublayer may comprise alkali metals of Group 1, Group 2 metals, Group 12 metals including rare earth elements, lanthanides and actinides, materials such as aluminum, indium, calcium, barium, samarium and magnesium, and combinations thereof. In some embodiments, the second cathode sublayer comprises Al, Ag, Au, Cu, Mg/Ag, or alloys thereof.

The thickness of a second cathode sublayer may also vary. For example, a second cathode sublayer may have a thickness of about 0.1 nm, about 1 nm, about 2 nm, about 4 nm, about 5 nm, about 6 nm, about 10 nm, about 12 nm, about 20 nm, about 50 nm, or any thickness in a range defined by, or between, any of these values. In some embodiments, a second cathode sublayer may have a thickness in a range of about 0.1 nm to about 50 nm, about 1 nm to about 20 nm, about 5 nm to about 20 nm, or about 12 nm.

In some embodiments, the first cathode sublayer comprises Ca and/or the second cathode sublayer comprises Au. In some embodiments, the first cathode sublayer is about 4 nm thick and/or the second cathode sublayer is about 12 nm thick.

A hole-injection layer, e.g., the hole-injection layer 115, may be any layer that is capable of injecting holes into another layer such as a hole-transport layer, an emissive layer, etc. A hole-injection layer may comprise any of a variety of materials that can inject electrons. For example, the hole-injection layer may comprise a high work function material. The term "high work function" has the ordinary meaning known to one of ordinary skill in the art. In some embodiments, a "high work function metal" is a metal or alloy that easily injects holes and typically has a work function greater than or equal to 4.5.

Some examples of hole-injection materials may include an optionally substituted compound selected from the following: a polythiophene derivative such as poly(3,4-ethylenedioxythiophene (PEDOT)/polystyrene sulphonic acid (PSS), a benzidine derivative such as N,N,N',N'-tetraphenylbenzidine, poly(N,N'-bis(4-butylphenyl)-N,N'-bis(phenyl)benzidine), a triphenylamine or phenylenediamine derivative such as N,N'-bis(4-methylphenyl)-N,N-bis(phenyl)-1,4-phenylenediamine, 4,4',4"-tris(N-(naphthylen-2-yl)-N-phenylamino)triphenylamine, an oxadiazole derivative such as 1,3-bis(5-(4-diphenylamino)phenyl-1,3,4-oxadiazol-2-yl)benzene, a polyacetylene derivative such as poly(1,2-bis-benzylthio-acetylene), a phthalocyanine metal complex derivative such as phthalocyanine copper (CuPc), a combination thereof, or any other material known in the art to be useful as a hole-injection material. In some embodiments, a hole-injection material may comprise a transition metal oxide, and/or may have a work function higher than about 5 eV.

In some embodiments, a hole-injection layer may have a thickness in a range of about 0.1 nm to about 100 nm, about 1 nm to about 20 nm, or about 8 nm to about 12 nm.

A hole-transport layer, e.g., the hole-transport layer 125, may be any layer that is capable of transporting holes from one layer to another, such as from a hole-injection layer to an emissive layer, or from an anode to an emissive layer, etc. A hole-transport layer may comprise any of a variety of materials. For example, a hole-transport layer material may comprise 4,4'-bis[N-(naphthyl)-N-phenyl-amino]biphenyl (NPB) (see structure below), an aromatic-substituted amine, a carbazole, a polyvinylcarbazole (PVK), e.g. poly(9-vinylcarbazole); polyfluorene; a polyfluorene copolymer; poly(9,9-di-n-octylfluorene-alt-benzothiadiazole); poly(paraphenylene); poly[2-(5-cyano-5-methylhexyloxy)-1,4-phenylene]; a benzidine; a phenylenediamine; a phthalocyanine metal complex; a polyacetylene; a polythiophene; a triphenylamine; copper phthalocyanine; 1,1-Bis(4-bis(4-methylphenyl)aminophenyl) cyclohexane; 2,9-Dimethyl-4,7-diphenyl-1,10-phenanthroline; 3,5-Bis(4-tert-butyl-phenyl)-4-pheny[1,2,4]triazole; 3,4,5-Triphenyl-1,2,3-triazole; 4,4',4"-tris(3-methylphenylphenylamino) triphenylamine (MTDATA); N,N'-bis(3-methylphenyl)N,N'-diphenyl-[1,1'-biphenyl]-4,4'-diamine (TPD); 4,4',4"-tris(carbazol-9-yl)-triphenylamine (TCTA); 4,4'-bis[N,N'-(3-tolyl)amino]-3,3'-dimethylbiphenyl (HMTPD); 4,4'-N,N'-dicarbazole-biphenyl (CBP); 1,3-N,N-dicarbazole-benzene (mCP); Bis[4-(p,p'-ditolyl-amino)phenyl]diphenylsilane (DTASi); 2,2'-bis(4-carbazolylphenyl)-1,1'-biphenyl (4CzPBP); N,N'N"-1,3,5-tricarbazoloylbenzene (tCP); N,N'-bis(4-butylphenyl)-N,N'-bis(phenyl)benzidine; a combination thereof; or any other material known in the art to be useful as a hole-transport material.

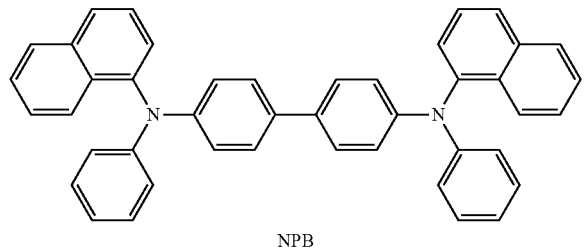 [SMILES: c1ccc(N(c2ccc(-c3ccc(N(c4ccccc4)c4cccc5ccccc45)cc3)cc2)c2cccc3ccccc23)cc1 ; "NPB"]

NPB

A hole-transport layer may optionally further comprise a dopant material such as transition metal oxide such as $MoO_3$, $V_2O_5$, $WO_3$, organic hole-injection materials such as CuPc, PEDOT, etc. In some embodiments, a hole-transport layer may comprise NPB and a dopant such as $MoO_3$. A hole-transport layer may be partially doped so that a discreet thickness of the layer near the emissive layer may remain undoped while the remainder of the layer is doped. A hole-transport layer may have a thickness that can vary. For example, a hole-transport layer may have a thickness of about 0.01 nm, about 1 nm, about 5 nm, about 10 nm, about 20 nm, about 30 nm, about 40 nm, about 50 nm, about 60 nm, or any thickness in a range bounded by, or between, any of these values. In some embodiments, a hole-transport layer may have a thickness in a range of about 0.1 nm to about 60 nm, about 1 nm to about 50 nm, or about 20 nm to about 50 nm.

Figure 1F:
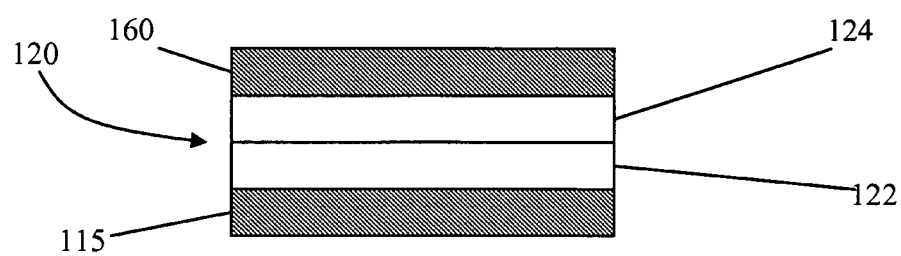

In some embodiments, a hole-transport layer 120 may be a combination of sublayers. For example, as shown in FIG. 1F, the hole-transport layer 120 may comprise a first hole-transport sublayer 122, disposed on hole-injection layer 115, and a second hole-transport sublayer 124, disposed on the first hole-transport sublayer 122. An emissive component 160 may be disposed on the second hole-transport sublayer 124. In some embodiments, the hole-transport layer may be partially doped. A partially doped hole-transport layer may comprise a first hole-transport sublayer 122 that is doped and a second hole-transport sublayer 124 that is undoped or a first hole-transport sublayer 122 that is undoped and a second hole-transport sublayer 124 that is doped. In some embodiments, a partially doped hole-transport layer may be a single layer having gradient doping instead of two or more distinct sublayers.

In some embodiments, a first hole-transport sublayer, e.g., the first hole-transport sublayer layer 122, may have a thickness of about 0.01 nm, about 1 nm, about 5 nm, about 10 nm, about 20 nm, about 30 nm, or any thickness in a range bounded by, or between, any of these values. In some embodiments, a first hole-transport sublayer may have a thickness in the range of about 0.01 nm to about 30 nm, about 1 nm to about 30 nm, or about 5 nm to about 30 nm.

In some embodiments, a second hole-transport sublayer, e.g., the second hole-transport sublayer layer 124, may have a thickness of about 1 nm, about 5 nm, about 10 nm, about 20 nm, about 30 nm, or any thickness in a range bounded by, or between, any of these values. In some embodiments, a second hole-transport sublayer may have a thickness in the range of about 1 nm to about 30 nm, about 1 nm to about 30 nm, or about 5 nm to about 30 nm.

In some embodiments, the first hole-transport sublayer may comprise NPB and a $MoO_3$ dopant. The concentration of $MoO_3$ in the first hole-transport sublayer may be about 5 wt %. The first hole-transport sublayer may have a thickness of about 5 nm to about 30 nm and may be disposed on the hole-injection layer.

In some embodiments, the second hole-transport sublayer may consist of NPB. The second hole-transport layer may have a thickness of about 10 nm.

In some embodiments an emissive component 160 comprises a first fluorescent light-emitting layer; a second fluorescent light-emitting layer; and an intervening phosphorescent light-emitting layer disposed between the first fluorescent light-emitting layer and the second fluorescent light-emitting layer. In some embodiments, additional phosphorescent light-emitting layers, such as a second intervening phosphorescent light-emitting layer, a third intervening phosphorescent light-emitting layer, etc., may be disposed between the intervening phosphorescent light-emitting layer and one of the first or second fluorescent light-emitting layers. For example, each intervening phosphorescent light-emitting layer may contain a phosphorescent dopant having a different color emission than the dopants of any other phosphorescent layers. With respect to the emissive components configured as described above, at least a portion of any intervening phosphorescent light-emitting layer may directly contact any of the corresponding luminescent light-emitting layers described above.

In some embodiments an emissive component 160 comprises a first phosphorescent light-emitting layer; a second phosphorescent light-emitting layer; and an intervening fluorescent light-emitting layer disposed between the first phosphorescent light-emitting layer and the second phosphorescent light-emitting layer. In some embodiments, additional intervening fluorescent light-emitting layers, such as a second intervening fluorescent light-emitting layer, a third intervening fluorescent light-emitting layer, etc., may be disposed between the intervening fluorescent light-emitting layer and one of the first or second phosphorescent light-emitting layers. For example, each fluorescent light-emitting layer may contain a fluorescent dopant having a different color emission than any dopants of any other phosphorescent layers. With respect to the emissive components configured as described above, at least a portion of any intervening fluorescent light-emitting layer may directly contact any of the corresponding phosphorescent light-emitting layers described above.

The composition of a fluorescent light-emitting layer may vary. If there are two fluorescent light-emitting layers, such as a first fluorescent light-emitting layer and a second fluorescent light-emitting layer, the two layers may have the same composition and/or physical properties, or may be different.

A fluorescent light-emitting layer, e.g. the first fluorescent light-emitting layer 125, the second light-emitting layer 135, and/or the intervening fluorescent light-emitting layer 126 may comprise a doped or undoped fluorescent host material, such as a fluorescent ambipolar host material which has blue emission. The wavelength properties of blue light may vary. For example, blue light may have a peak emission or an average emissive wavelength of about 430 nm, about 450 nm, about 480 nm, about 500 nm, or any wavelength in a range bounded by, or between, any of these values. In some embodiments, a fluorescent host material may have a peak emission or an average emissive wavelength in the range of about 430 nm to about 500 nm, about 430 nm to about 480 nm, about 450 to about 480 nm, or about 450 nm to about 500 nm.

A peak emission includes a wavelength where there appears to be a peak on a plot of a visible spectrum of a material. An average emissive wavelength is a wavelength at which the area of the plot of a visible spectrum at wavelengths lower than the average emissive wavelength is about equal to the area of the plot of a visible spectrum at wavelengths higher than the average emissive wavelength.

A fluorescent light-emitting layer, e.g. the first fluorescent light-emitting layer 125, the second light-emitting layer 135, and/or the intervening fluorescent light-emitting layer 126 may comprise a material, such as an ambipolar host material, that may have a triplet energy that is greater than a triplet energy of the phosphorescent light-emitting layer. This may allow the triplet energy of the fluorescent layer to be transferred to the phosphorescent layer, where it may be emitted as phosphorescence. Thus, the triplet energy may produce phosphorescent emission instead of being lost by a nonradiative relaxation process in the fluorescent layer. This three-layer design may improve the efficiency of a light-emitting device.

In some embodiments, the fluorescent light-emitting layer, e.g. the first fluorescent light-emitting layer 125, the second light-emitting layer 135, and/or the intervening fluorescent light-emitting layer 126 may comprise a compound selected from the group consisting of:

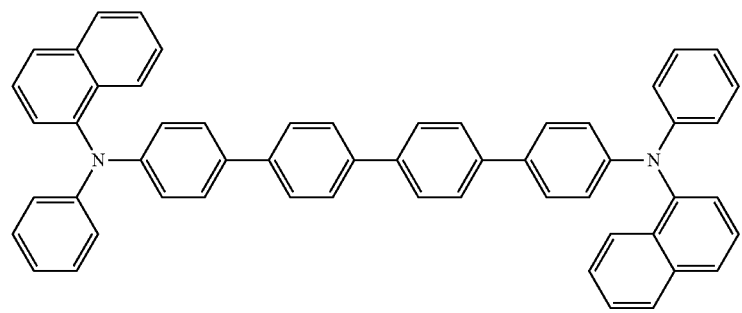
4P-NPD
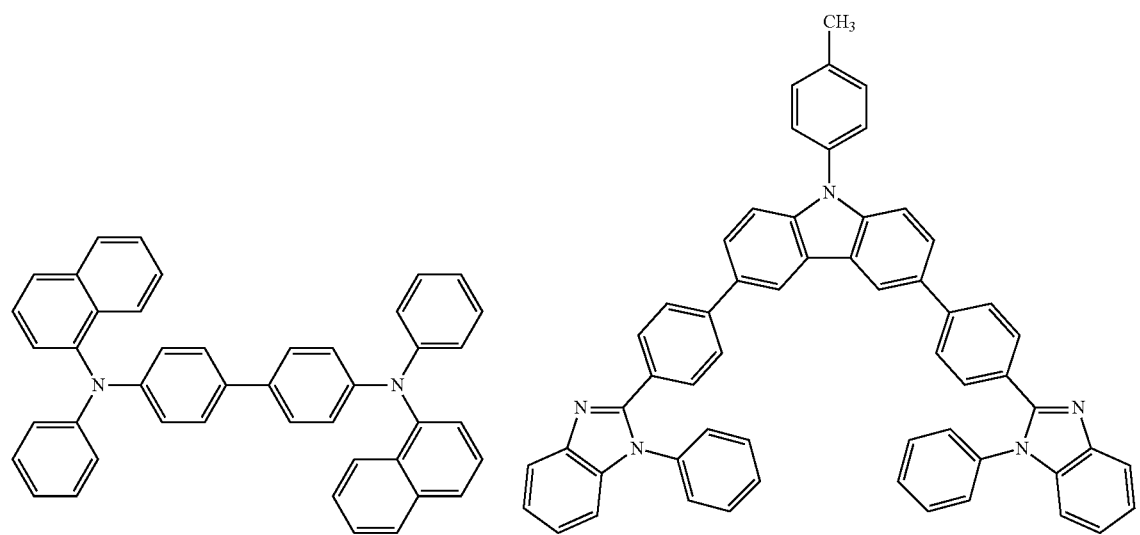
NPD
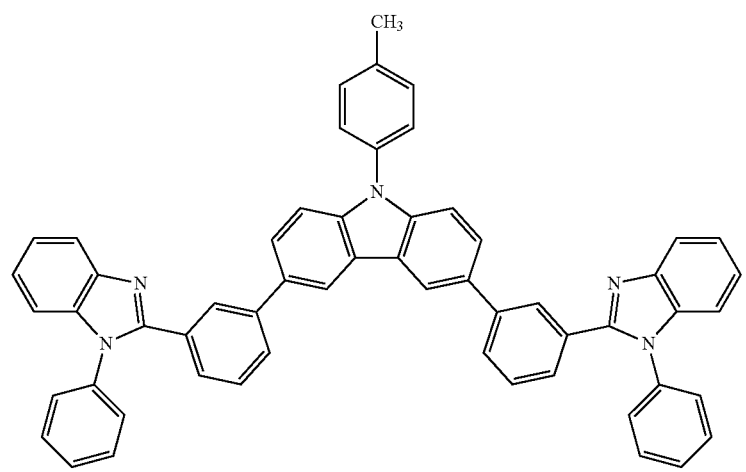

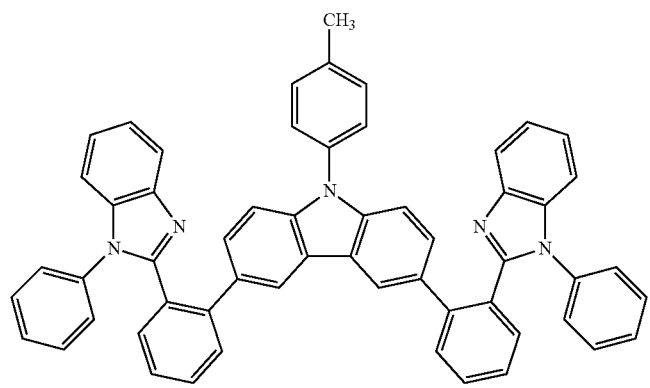
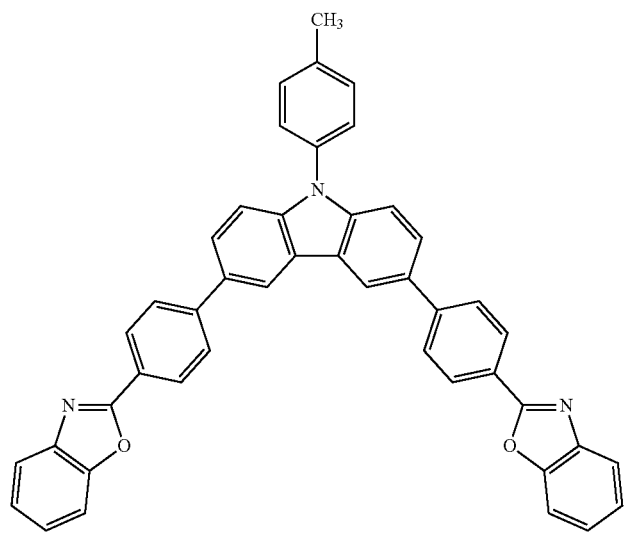
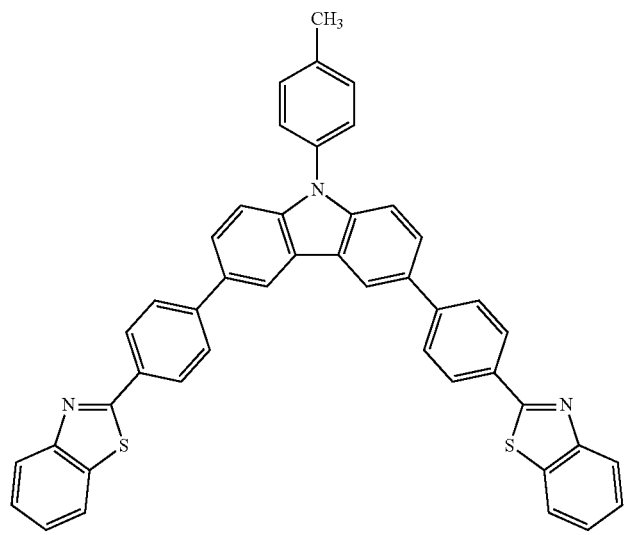

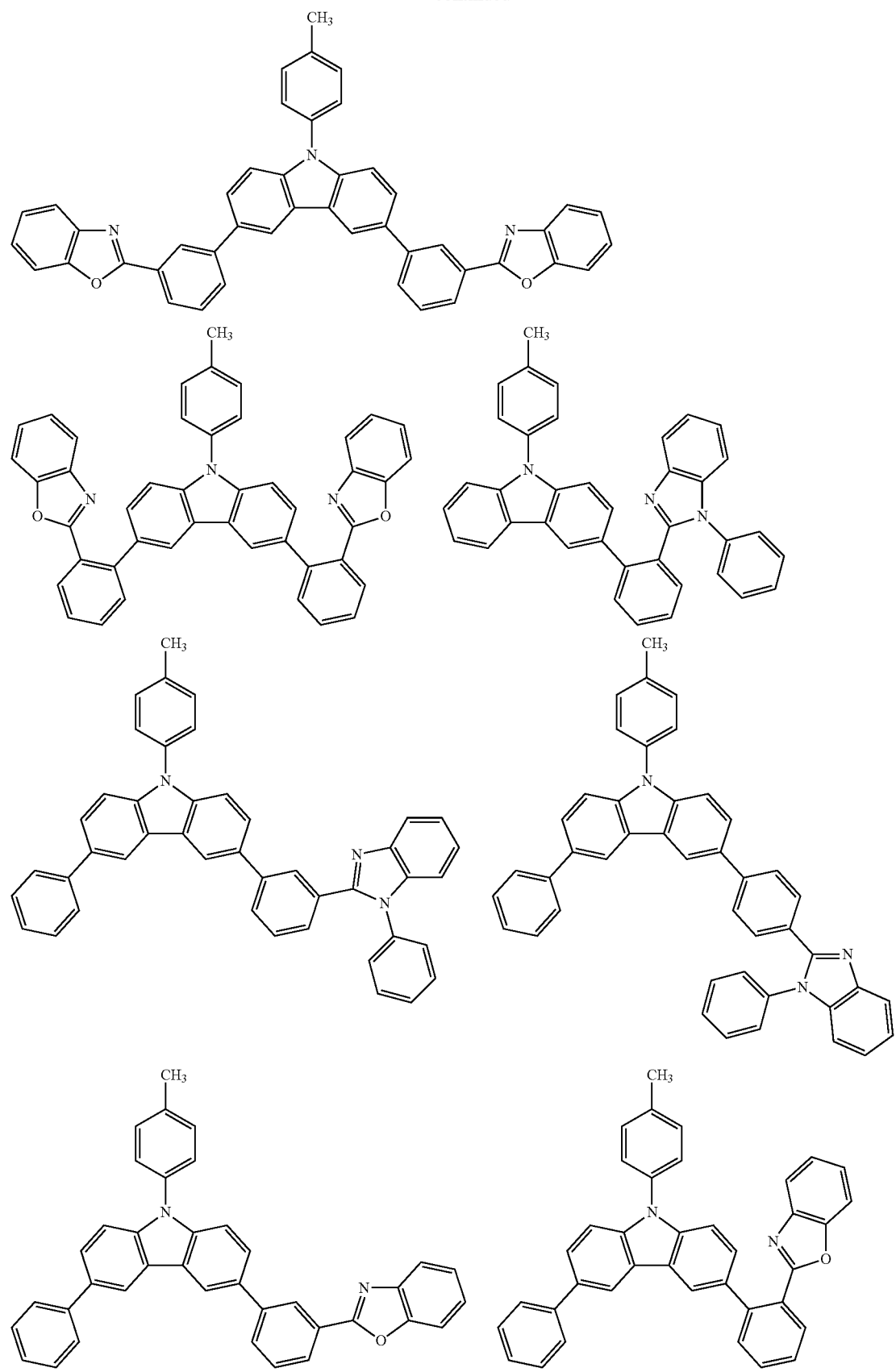

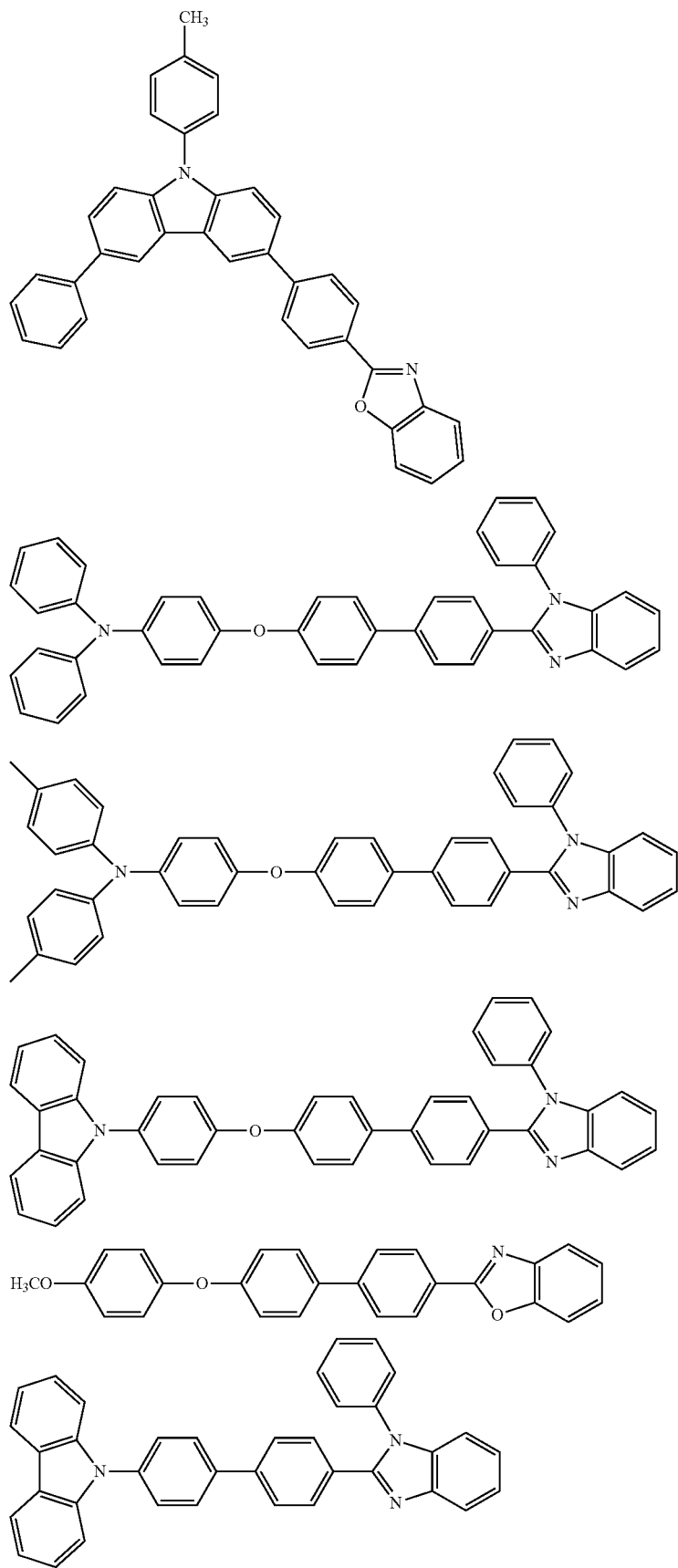

-continued
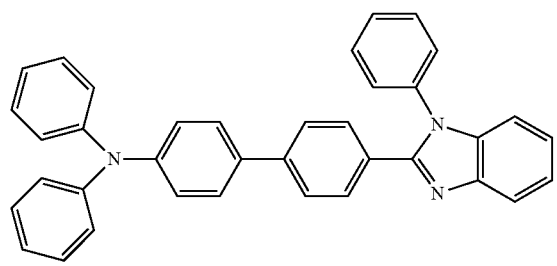
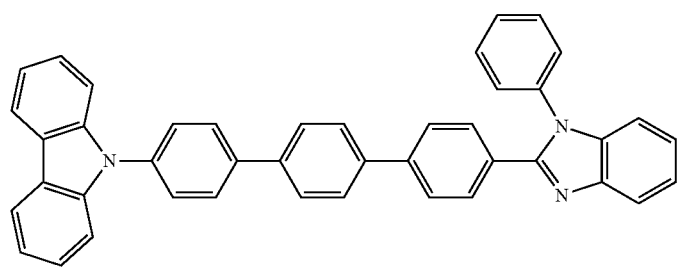
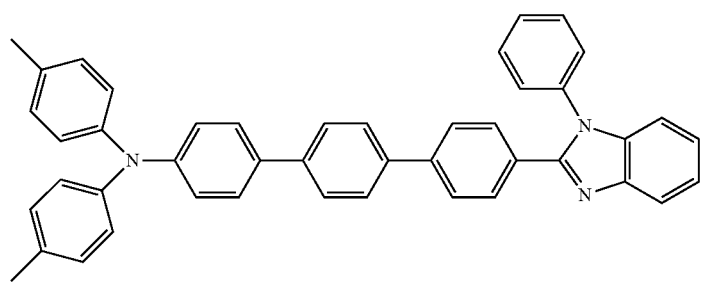
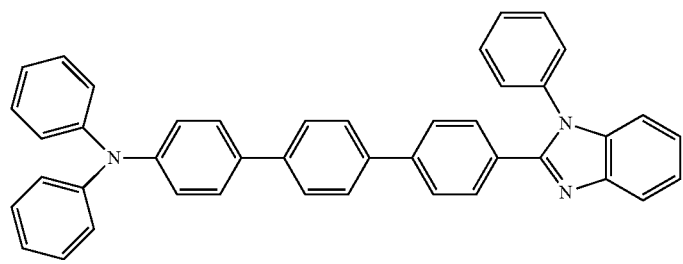
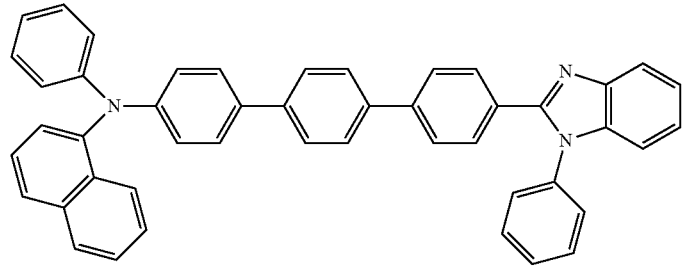
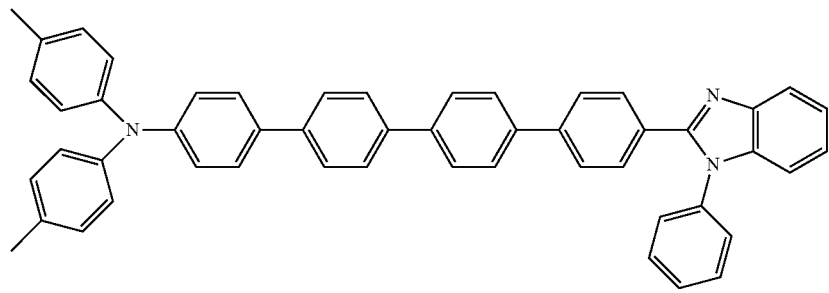

-continued
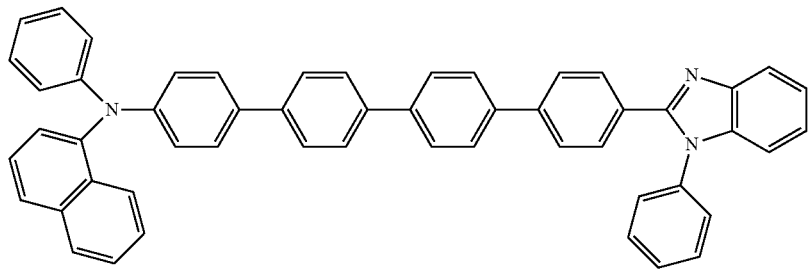
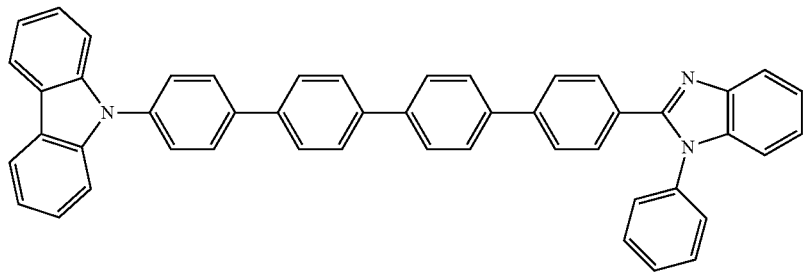
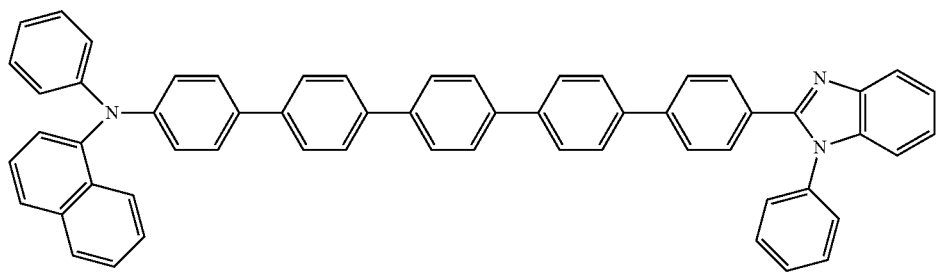
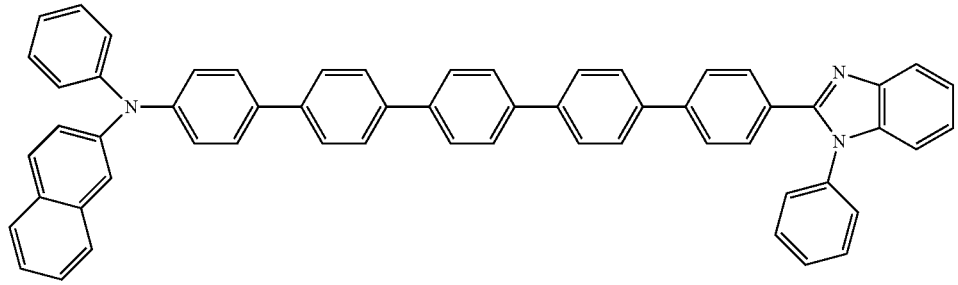
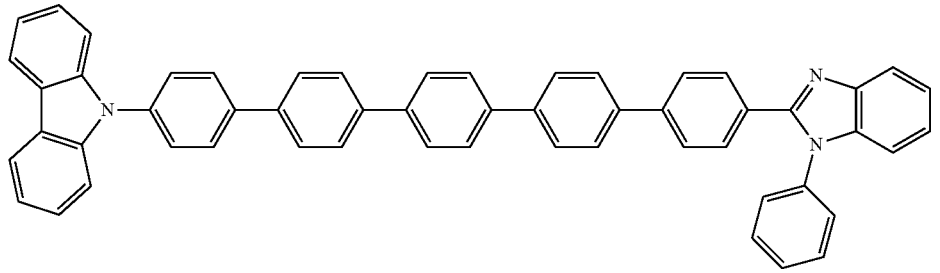
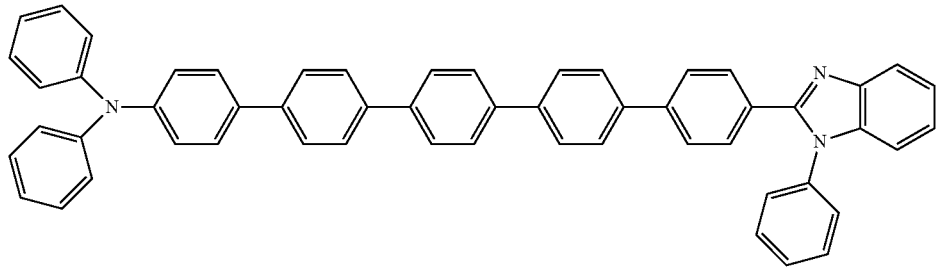

-continued

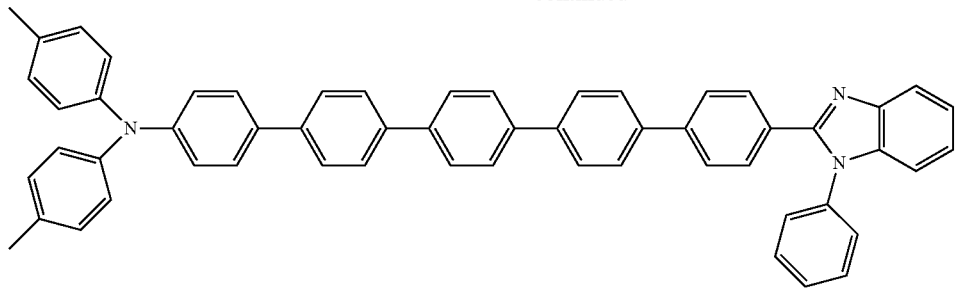 [SMILES: Cc1ccc(N(c2ccc(C)cc2)c2ccc(-c3ccc(-c4ccc(-c5ccc(-c6ccc(-c7nc8ccccc8n7-c7ccccc7)cc6)cc5)cc4)cc3)cc2)cc1]

The fluorescent light-emitting layer may also comprise any fluorescent compound or host material described in any of the following documents: U.S. Provisional Application No. 61/221,472 or U.S. Patent Application Publication No. 2010/0326526, both of which are incorporated by reference in their entireties, and particularly for the purpose of describing fluorescent compounds and host materials.

The thickness of a fluorescent light-emitting layer may vary. For example, a fluorescent light-emitting layer may have a thickness of about 5 nm, about 10 nm, about 15 nm, about 20 nm, about 30 nm, about 50 nm, about 80 nm, about 100 nm, or any thickness in a range bounded by, or between, any of these values. In some embodiments, the thickness of a fluorescent light-emitting layer may be in a range of about 5 nm to about 100 nm, about 5 nm to about 50 nm, or about 10 nm to about 20 nm.

The composition of a phosphorescent light-emitting layer may vary. If there are two phosphorescent light-emitting layers, such as a first phosphorescent light-emitting layer and a second phosphorescent light-emitting layer, the two layers may have the same composition and/or physical properties, or may be different.

A phosphorescent light-emitting layer, e.g. the first phosphorescent light-emitting layer 131, the second phosphorescent light-emitting layer 132, and/or the intervening phosphorescent light-emitting layer 130 may emit any color light. In some embodiments, a phosphorescent light-emitting layer may emit orange light. The wavelength properties of orange light may vary. For example, orange light may have a peak emission or an average emissive wavelength of about 570 nm, about 585 nm, about 600 nm, about 620 nm, 630 nm, 650 nm, or any wavelength in a range bounded by, or between, any of these values. In some embodiments, the phosphorescent light-emitting layer may have a peak emission or an average emissive wavelength of about 570 nm to about 650 nm, about 585 nm to about 650 nm, about 570 nm to about 630 nm, or about 585 nm to about 630 nm.

A phosphorescent light-emitting layer, e.g. the first phosphorescent light-emitting layer 131, the second phosphorescent light-emitting layer 132, and/or the intervening phosphorescent light-emitting layer 130 may comprise a host, such as a blue emitting host, and a phosphorescent dopant material, such as an orange emitting phosphorescent dopant material. A combination of phosphorescent dopants may be used, such as a combination of two or more phosphorescent emitters that emit visible light in the red to green range. Such a combination of phosphorescent dopants may be combined in a single phosphorescent layer or in more than one distinct phosphorescent layer. Some phosphorescent light-emitting layers, or combination of layers, may comprise a combination of at least two of: a red emitter, a green emitter, and a yellow emitter.

The wavelength ranges of red, green, yellow, and emitters of other colors may overlap. One of the reasons for this is that the color perceived may vary by individual, for example a color may appear red to one person and orange to another person, or it may be difficult for an individual to decide whether a color is orange or red. For example, green emitters may have a peak emission or an average emissive wavelength of about 480 nm, about 490 nm, about 500 nm, about 550 nm, about 570 nm, about 580 nm, or any wavelength in a range bounded by, or between, any of these values. In some embodiments, a green emitter may have a peak emission or an average emissive wavelength in the range of about 490 nm to about 570 nm, about 500 nm to about 570 nm, or about 490 nm to about 550 nm. Yellow emitters may have a peak emission or an average emissive wavelength of about 565 nm, 570 nm, 575 nm, 580 nm, 585 nm, 590 nm, or any wavelength in a range bounded by, or between, any of these values. In some embodiments, a yellow emitter may have a peak emission or an average emissive wavelength in the range of 570 nm to about 585 nm, about 575 nm to about 585 nm, or about 570 nm to about 580 nm. Red emitters may have a peak emission or an average emissive wavelength of about 610 nm, 620 nm, 630 nm, 650 nm, 700 nm, 750 nm, 780 nm, 800 nm, or any wavelength in a range bounded by, or between, any' of these values. In some embodiments, a red emitter may have a peak emission or an average emissive wavelength in the range of about 620 nm to about 780 nm, about 630 nm to about 780 nm, or about 620 nm to about 750 nm.

Some phosphorescent light-emitting layers may comprise a combination of a green emitter and a red emitter, or a combination of a yellow emitter and red emitter. In some embodiments, a phosphorescent light-emitting layer may comprise two phosphorescent emitters, wherein each emitter emits visible light in the red to green range, e.g. about 480 nm to about 800 nm, about 490 nm to about 780 nm, about 490 to about 750 nm, or about 500 nm to about 780 nm.

The color of the light emitted by an emissive component may be tuned according to any phosphorescent dopants used. For example, the color of the emitted light may depend upon the color of the light emitted from a phosphorescent dopant. The color of the emitted light may also depend upon the concentration of a phosphorescent dopant. For example, an increased concentration of a green phosphorescent dopant may make the light emitted by an emissive component to be greener, or an increased concentration of an orange phosphorescent dopant may make the light emitted by an emissive component more orange, etc. Thus, the color may be tuned to obtain a white light-emitting emissive component, or an emissive component that emits any desired color.

In some embodiments, a phosphorescent dopant may comprise an Ir complex. Some examples of phosphorescent dopants comprising an Ir complex may include Ir-(pq)2acac, Ir(phq)2acac, Ir(piq)2acac, Ir(piq)3, YE-1; YE-2, etc. For example, the first phosphorescent dopant and/or the second phosphorescent dopant may comprise at least one of: Ir-(pq)2acac, Ir(phq)2acac, Ir(piq)2acac, Ir(piq)3, YE-1, and YE-2. Some phosphorescent light-emitting layers may comprise YE-2 and Ir(piq)2acac.

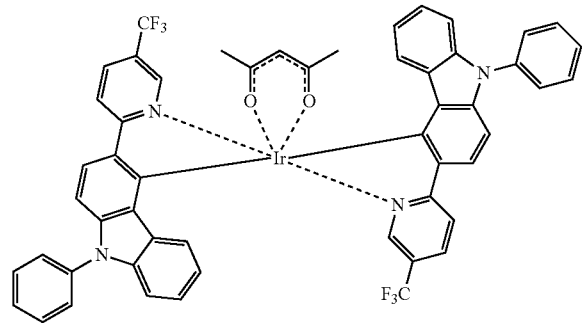

YE-1

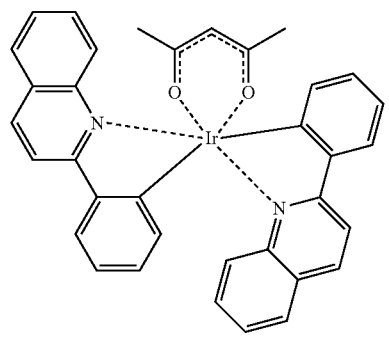

[Ir(pq)2(acac)]

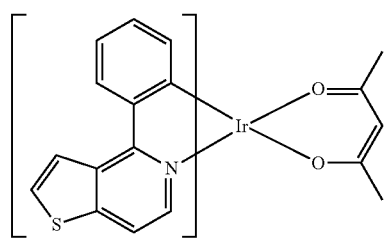

YE-2

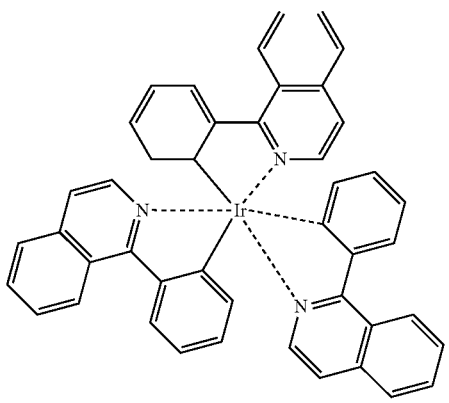

Ir(piq)3

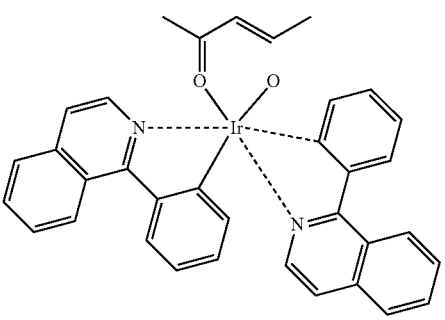

Ir(piq)2acac

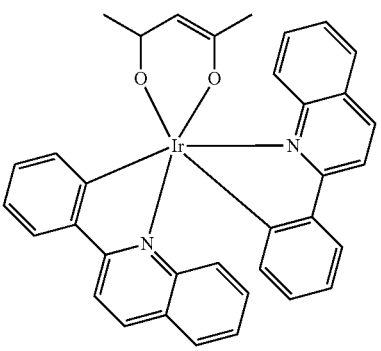

Ir(phq)₂acac

In some embodiments, if the host is a blue emitting host, the host may be one of the materials of a fluorescent light-emitting layer described above. In some embodiments, the host of a phosphorescent light-emitting layer is the same as a host material of a fluorescent light-emitting layer. In some embodiments, any one or combination of the first phosphorescent light-emitting layer, the second phosphorescent light-emitting layer, or the intervening phosphorescent light-emitting layer may comprise the fluorescent host material of the first fluorescent light-emitting layer. Depending upon the structure of the emissive layers, the second fluorescent light-emitting layer may be undoped fluorescent host material of the first fluorescent light-emitting layer, or the second phosphorescent light-emitting layer may also comprise the fluorescent host material of the first fluorescent light-emitting layer.

The thickness of a phosphorescent light-emitting layer may vary. In some embodiments, the thickness of a phosphorescent light-emitting layer may be about 1 nm, about 5 nm, about 10 nm, about 50 nm, about 80 nm, about 100 nm, or any thickness in a range bounded by, or between, any of these values. In some embodiments, the thickness of a phosphorescent light-emitting layer may be in a range of about 1 nm to about 100 nm, about 1 nm to about 50 nm, or about 1 nm to about 10 nm.

In some embodiments, the phosphorescent light-emitting layer, e.g. the first phosphorescent light-emitting layer 131, the second phosphorescent light-emitting layer 132, and/or the intervening phosphorescent light-emitting layer 130 comprises:

a host comprising Host-1:

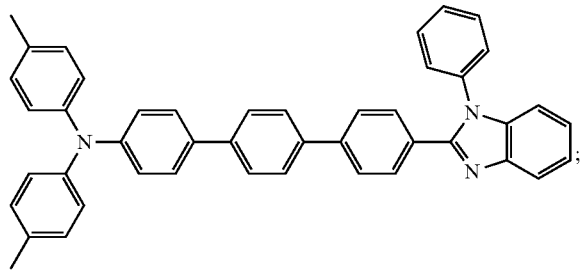 [SMILES: Cc1ccc(N(c2ccc(C)cc2)c2ccc(-c3ccc(-c4ccc(-c5nc6ccccc6n5-c5ccccc5)cc4)cc3)cc2)cc1]

about 5% by weight of YE-2; and about 0.5% by weight of Ir(piq)2acac; wherein the thickness of the phosphorescent light-emitting layer is about 5 nm.

An electron-transport layer, e.g., the electron-transport layer 140, may comprise at least one electron-transport material. Examples of electron-transport materials may include: 2-(4-biphenylyl)-5-(4-tert-butylphenyl)-1,3,4-oxadiazole (PBD); 1,3-bis(N,N-t-butylphenyl)-1,3,4-oxadiazole (OXD-7), 1,3-bis[2-(2,2'-bipyridine-6-yl)-1,3,4-oxadiazo-5-yl]benzene; 3-phenyl-4-(1'-naphthyl)-5-phenyl-1,2,4-triazole (TAZ); 2,9-dimethyl-4,7-diphenyl-phenanthroline (bathocuproine or BCP); aluminum tris(8-hydroxyquinolate) (Alq3); and 1,3,5-tris(2-N-phenylbenzimidazolyl)benzene; 1,3-bis[2-(2,2'-bipyridine-6-yl)-1,3,4-oxadiazo-5-yl]benzene (BPY-OXD); 3-phenyl-4-(1'-naphthyl)-5-phenyl-1,2,4-triazole (TAZ), 2,9-dimethyl-4,7-diphenyl-phenanthroline (bathocuproine or BCP); and 1,3,5-tris[2-N-phenylbenzimidazol-z-yl]benzene (TPBI). In some embodiments, the electron transport layer may be aluminum quinolate ($Alq_3$), 2-(4-biphenylyl)-5-(4-tert-butylphenyl)-1,3,4-oxadiazole (PBD), phenanthroline, quinoxaline, 1,3,5-tris[N-phenylbenzimidazol-z-yl]benzene (TPBI), a derivative or a combination thereof, or any other material known in the art to be useful as an electron-transport material.

The thickness of the electron-transport layer may vary. For example, the electron-transport layer may have thickness of: about 1 nm, about 5 nm, about 10 nm, about 20 nm, about 30 nm, about 40 nm, about 50 nm, about 60 nm, or any thickness in a range bounded by, or between, any of these values. In some embodiments, an electron-transport layer may have thickness in a range of about 1 nm to about 60 nm, about 5 nm to about 50 nm, or about 20 nm to about 40 nm.

Some optional layers may comprise an exciton-blocking material. Examples of exciton-blocking materials may include an optionally substituted compound selected from the following: 4,4'-bis[N-(naphthyl)-N-phenyl-amino]biphenyl (α-NPD), 4,4'-N,N'-dicarbazole-biphenyl (CBP), and bathocuproine (BCP), and any other material(s) that have a large enough band gap to substantially prevent the diffusion of excitons.

Some optional layers may comprise an electron-injection material. Examples of suitable electron injection materials may include but are not limited to: LiF, CsF, Cs doped into electron-transport material as described above or a derivative or a combination thereof.

An enhancement layer, e.g., the enhancement layer 150, may be any layer that enhances the emission of light from an OLED device. An enhancement layer may comprise any material that is capable of increasing the emission of light by an OLED device. An enhancement layer may comprise any material that is substantially transparent to visible light. In one embodiment, substantially transparent materials may transmit at least 75% of the visible light impinging upon it. In some embodiments, substantially transparent materials may transmit at least 80%, 85%, 90%, 95% and/or 97% of the visible light impinging upon it. In an embodiment, the enhancement layer comprises a visible light substantially transparent material having refractive index higher than about 1.5. Examples of such materials may include, but are not limited to, transparent materials including organic small molecule materials such as NPB, TPBI, Alq3; metal oxides such as $MoO_3$, $WO_3$, $SnO_2$ and SnO; wide band gap semiconductor compounds; etc.

The refractive index of a material of an enhancement layer may vary. For example, an enhancement layer may comprise a material having refractive index of about 1.5, about 1.6, about 1.8, about 2, about 2.5, or any refractive index in a range bounded by, or between, any of these values. In some embodiments, an enhancement layer may comprise a material having refractive index in a range of about 1.5 to about 2.5, about 1.6 to about 2.5, or about 1.5 to about 2.

The thickness of an enhancement layer may vary. For example, the enhancement layer may have a thickness of about 0.01 nm, about 1 nm, about 10 nm, about 20 nm, about 40 nm, about 50 nm, about 60 nm, about 70 nm, about 80 nm, about 100 nm, about 150 nm, about 200 nm, or any thickness in a range bounded by, or between, any of these values. In some embodiments, an enhancement layer may have a thickness in a range of about 0.01 nm to about 200 nm, about 1 nm to about 100 nm, or about 40 nm to about 80 nm.

A light-scattering layer, e.g., the light-scattering layer 155, may be any layer that is capable of scattering light. A light-scattering layer may comprise any material and may have any morphology that is capable of scattering light. In some embodiments, a light-scattering layer may comprise a porous film.

The thickness of a light-scattering layer may vary. In some embodiments, a light-scattering layer may have a thickness in the nanometer to micro range. For example, the thickness of the film may be about 500 nm, about 0.1 μm, about 1 μm, about 1.3 μm, about 3 μm, or about 4 μm, about 5 μm, about 7 μm, about 10 μm, about 20 μm, about 100 μm, or any thickness in a range bounded by, or between, any of these values. In some embodiments, the light scattering layer may have a thickness in the range of about 0.1 nm to about 10 μm, about 1 μm to about 10 μm, or about 1 μm to about 5 μm.

If a light-scattering layer comprises a porous film, a porous film may have a variety of structures. In some embodiments, a porous film may have a surface comprising a plurality of irregularly arranged protrusions, particles, or aggregates thereof. The protrusions or particles may be nanoprotrusions, including nanoprotrusions having one or more dimensions in the nanometer to micron range. For example, nanoprotrusions or nanoparticles may have: an average largest dimension of about 400 nm, about 500 nm, about 1000 nm, about 1500 nm, about 2000 nm, about 2500 nm, about 3000 nm, or any value in a range bounded by, or between, any of these lengths; and/or an average smallest dimension of about 10 nm, about 30 nm, about 50 nm, about 70 nm, about 90 nm, about 100 nm, or any value in a range bounded by, or between, any of these lengths. In some embodiments, at least one particle in the film, or average of the particles in the film, may have any dimension of: about 5 nm, about 0.01 μm, about 0.02 μm, about 0.05 μm, about 0.1 μm, about 0.5 μm, about 1 μm, about 2 μm, about 5 μm, about 10 μm, about 20 μm, about 50 μm, about 100 μm, about 150 μm, about 200 µm, about 500 µm, about 1000 µm, or any length bounded by, or between, any of these values. In some embodiments, the nanoprotrusions or nanoparticles may have: an average x dimension in the range of about 400 nm to about 3000 nm, about 1000 nm to about 3000 nm, or about 2000 nm to about 3000 nm; an average y dimension in the range of about 100 nm to about 2000 nm, about 100 nm to about 1500 nm, or about 100 nm to about 1000 nm; and/or an average z dimension of about 10 nm to about 100 nm, about 30 nm to about 90 nm, or about 30 nm to about 70 nm. In some embodiments, at least one particle in the film, or average of the particles in the film, may have an x dimension, a y dimension, or a z dimension in the range of: about 5 nm to about 1000 µm, about 0.02 µm to about 1 µm, or about 1 µm to about 200 µm.

A porous film may comprise a pore or a void. For example, a porous film may comprises a plurality of voids having a total volume that may be about 50%, about 70%, about 80%; about 85%, about 90%, about 95%, or about 99% of the volume of the film including the voids, or any percentage of total volume in a range bounded by, or between, any of these values. Thus, if the total volume of the voids is 50% of the volume of the film, 50% of the volume of the film is the material of the film and 50% of the volume of the film is the plurality of voids. In some embodiments, a porous film may comprises a plurality of voids having a total volume in the range of about 50% to about 99%, about 80% to about 99%, or about 95% to about 99% of the volume of the film.

In some embodiments, a light-scattering layer may comprise a porous film that may comprises a plurality of voids of a number and size such that the film may have a thickness that is about 2 times, about 10 times; up to about 50 times, or 100 times, that of the thickness of a film of the same material which has no voids, or any thickness ratio in a range bounded by, or between, any of these values. For example, a film may have a thickness of about 5 µm when a film of the same material would have a thickness of 800 nm if the film had no voids. In some embodiments, the film may have a thickness that is in the range of about 2 times to about 100 times or about 2 to about 10 times that of the thickness of a film of the same material which has no voids.

The size of the voids in a light-scattering layer may vary. In some embodiments, at least about 10% of the voids have a largest dimension of about 0.5 µm, about 1 µm, about 2 µm, about 3 µm, about 4 µm, about 5 µm, or any length in a range bounded by, or between, any of these values. In some embodiments, at least one void in the film, or average of the voids in the film, may have any dimension of: about 5 nm, about 0.01 µm, about 0.02 µm, about 0.05 µm, about 0.1 µm, about 0.5 µm, about 1 µm, about 2 µm, about 5 µm, about 10 µm, about 20 µm, about 50 µm, about 100 µm, about 150 µm, about 200 µm, about 500 µm, about 1000 µm, or any length bounded by, or between, any of these values. In some embodiments, at least one void in the film, or an average of the voids in the film, may have an x dimension, a y dimension, or a z dimension in the range of: about 0.01 µm to about 5 µm, about 0.01 µm to about 1 µm, about 0.01 µm to about 10 µm, about 0.01 µm to about 20 µm, about 0.01 µm to about 5 µm, about 0.02 µm to about 10 µm, about 0.05 µm to about 10 µm, about 0.1 µm to about 10 µm, about 0.1 µm to about 100 µm, about 0.1 µm to about 150 µm, about 0.1 µm to about 20 µm, about 0.1 µm to about 5 µm, about 0.5 µm to about 50 µm, about 1 µm to about 100 µm, about 1 µm to about 20 µm, about 1 µm to about 200 µm, about 1 µm to about 50 µm, about 1 µm to about 500 µm, about 10 µm to about 50 µm, about 10 nm to about 5 µm, about 2 µm to about 100 µm, about 20 µm to about 1000 µm, about 5 nm to about 5 µm, about 50 nm to about 2 µm, or about 50 nm to about 5 µm.

The density of a light-scattering layer may vary, and may be affected by the voids, the material, and other factors. In some embodiments, the density of the film including the voids may be about 0.005 picograms/µm$^3$, about 0.05 picograms/µm$^3$, about 0.1 picograms/µm$^3$, about 0.3 picograms/µm$^3$, about 0.5 picograms/µm$^3$, about 0.9 picograms/µm$^3$, or any density in a range bounded by, or between, any of these values. In some embodiments, the including the voids may be in the range of about: about 0.005 picograms/µm$^3$ to about 0.9 picograms/µm$^3$, about 0.05 picograms/µm$^3$ to about 0.7 picograms/µm$^3$, or about 0.1 picograms/µm$^3$ to about 0.5 picograms/µm$^3$.

The refractive index of the material of the light-scattering layer may vary. For example, the refractive index may be about 1.1, about 1.5, about 1.7, about 1.8, or any refractive index in a range bounded by, or between, any of these values. In some embodiments, the refractive index of the material of the porous film may be greater than or equal to that of the substrate. In some embodiments, the refractive index may be in the range of about 1.1 to about 1.8, about 1.1 to about 1.7, or about 1.1 to about 1.5.

A light-scattering layer may comprise a material that includes an organic compound, such as a non-polymeric organic compound that may comprise an optionally substituted aromatic ring. In some embodiments, the light-scattering layer may comprise at least one of the compounds below:

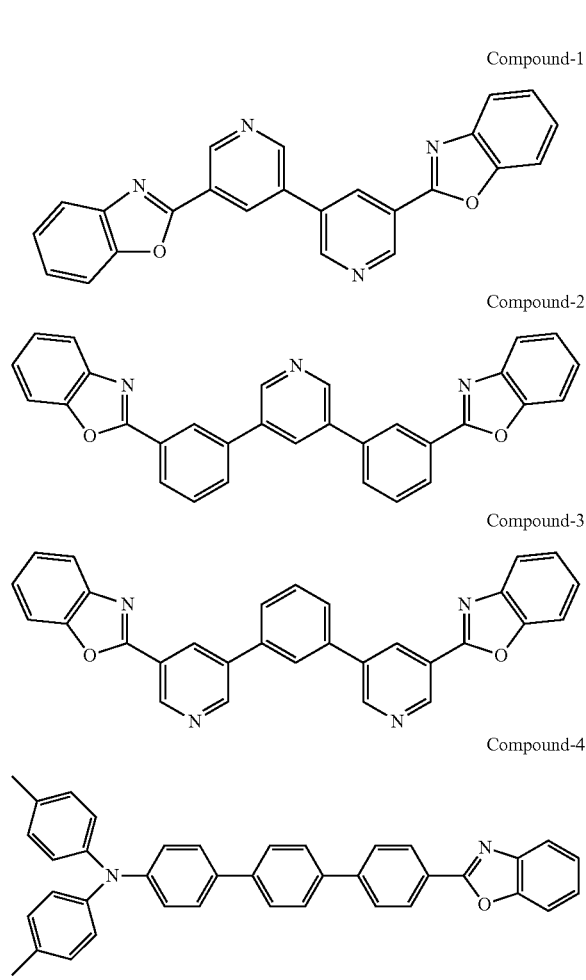

Compound-1

Compound-2

Compound-3

Compound-4

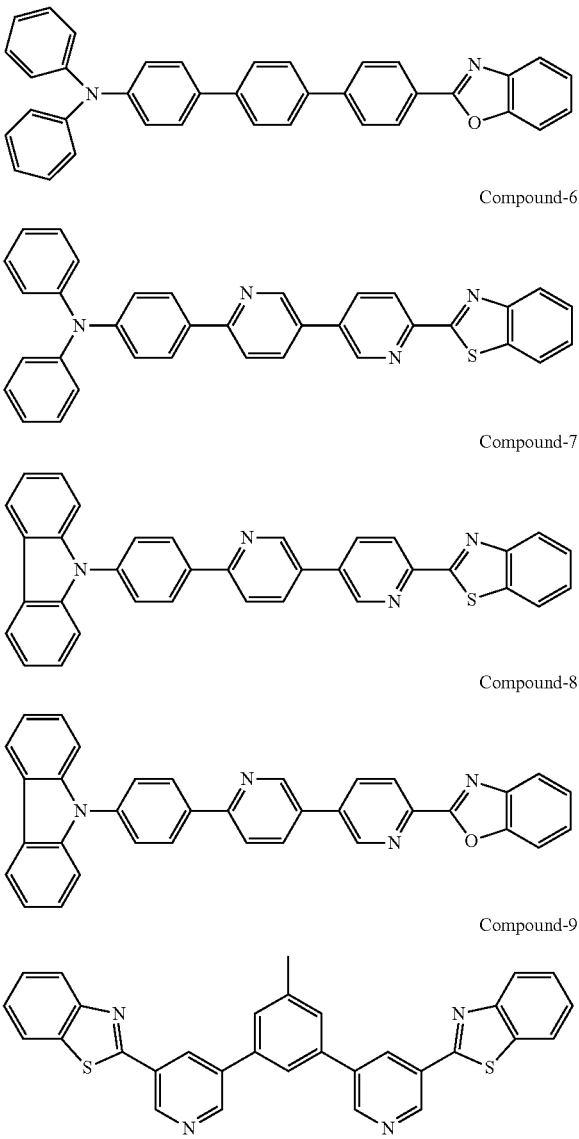

Other compounds that may be useful in light-scattering layers include any compound described in one of the following documents: U.S. Provisional Application No. 61/221,427, filed Jun. 29, 2009, which is incorporated by reference herein in its entirety and particularly for the purpose of describing such compounds; US 20100326526, which is incorporated by reference herein its entirety and particularly for the purpose of describing such compounds; U.S. Provisional Patent Application No. 61/383,602, filed Sep. 16, 2010, which is incorporated by reference herein in its entirety and particularly for the purpose of describing such compounds; and U.S. Provisional Application No. 61/426,259, filed Dec. 22, 2010, which is incorporated by reference herein in its entirety and particularly for the purpose of describing such compounds.

A porous film for a light-scattering layer may be prepared by depositing a material on a surface, such as a substrate or a light enhancement layer. In some embodiments, the material may be deposited on a substantially transparent layer. Deposition and/or subsequent annealing conditions may affect the characteristics of the film.

The rate of deposition of the material on, a surface may vary. For example, the deposition rate may be: about 0.1 A/sec, about 0.2 A/sec, about 1 A/sec, about 10 A/sec, about 100 A/sec, about 500 A/sec, about 1000 A/sec, or any value in a range bounded by, or between, any of these deposition rates.

The material may be deposited onto a variety of surfaces to form a film. For some devices, the material may be deposited onto an anode, a cathode, or a transparent layer.

A material that has been deposited on a surface may be further treated by heating or annealing. The temperature of heating may vary. For example, the a precursor material may be heated at a temperature of about 100° C., about 110° C., about 120° C., about 150° C., about 180° C., about 200° C., about 130° C., about 260° C., about 290° C., or any temperature in a range bounded by, or between, any of these values.

The time of heating may also vary. For example, the material may be heated for about 5 minutes, about 15 minutes, about 30 minutes, about 60 minutes, or any amount of time in a range bounded by, or between, any of these values. In some embodiments, a material may be heated at about 100° C. to about 260° C. for about 5 minutes to about 30 minutes.

In some embodiments a light-scattering layer may comprise Compound-2 and may have a density of about 80% and/or a thickness greater than about 4 μm. In some embodiments, Compound-2 may be heated at about 110° C. and/or heating may be carried out for about 60 min.

In some embodiments a light-scattering layer may comprise Compound-3 and may have a thickness of about 1.3 μm. In some embodiments, Compound-3 may be heated at about 180° C. and/or heating may be carried out for about 15 minutes.

Other examples of porous films that may be used in light-scattering layer are included in U.S. Provisional Application No. 61/449,032, filed Mar. 3, 2011 with the title "Porous Films For Use In Light-Emitting Devices," which is incorporated by reference in its entirety herein.

Example 1

Device A was prepared having a structure consistent with that depicted in FIG. 1. The layers of the device, from bottom to top were: a substrate 105 [Glass (0.7 mm)/ITO (55 nm)/PEDOT (30 nm); a reflective-opaque anode 110 (Al, 50 nm; then Ag, 50 nm); a hole-injection layer 115 (MoO₃, 10 nm); a hole-transport layer 120 (NPB:MoO3 [5%], 20 nm; NPB, 10 nm); a blue emissive layer 125 (Host-1, 15 nm); an orange phosphorescent layer 130 (Host-1:YE-2 [5%]:Ir(piq) 2acac [0.5%], 5 nm); a blue emissive layer 135 (Host-1, 15 nm); an electron-transport layer 140 (TPBI, 30 nm); a semi-transparent cathode 145 (bottom layer of Ca, 4 nm; top layer of Au, 12 nm); an enhancement layer 150 (SnO₂, 60 nm); and a light-scattering layer 155 (Compound-2, 4000 nm).

Figure 2:
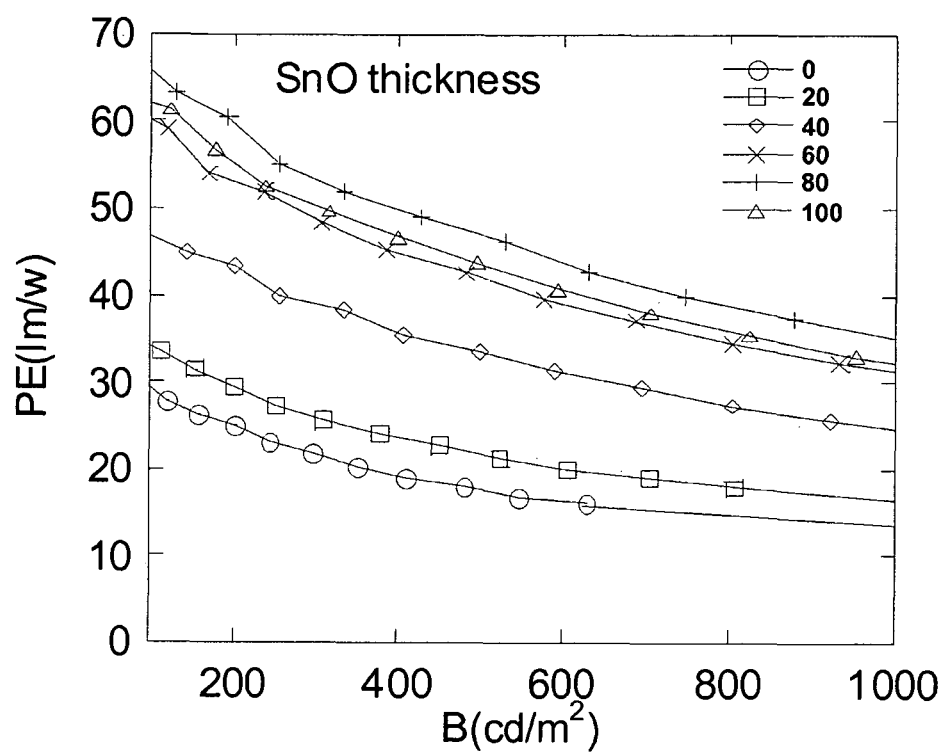
FIG. 2 is a plot of power efficiency (PE) as a function of device brightness of an embodiment of a light-emitting device at various enhancement layer thicknesses.
Figure 3A:
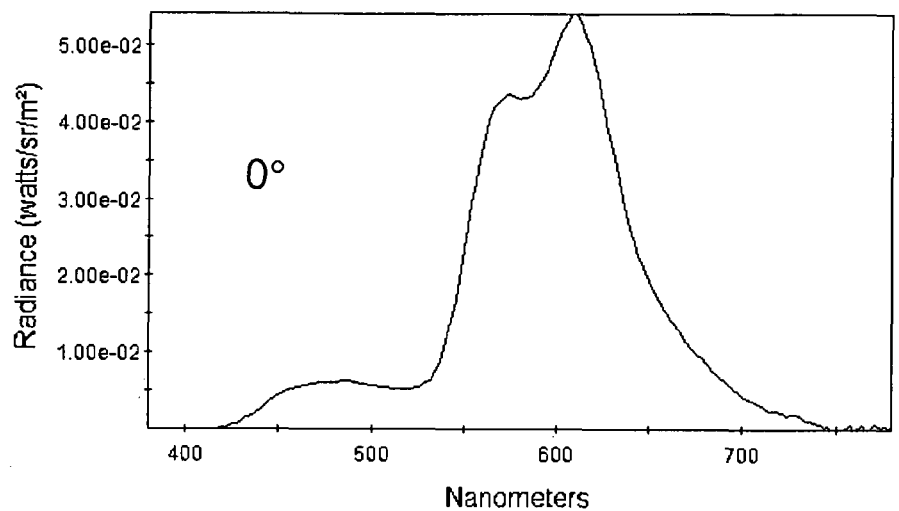
FIG. 3A and FIG. 3B are plots of the electroluminescence spectrum vs. viewing angle of an embodiment of a light-emitting device.
Figure 3B:
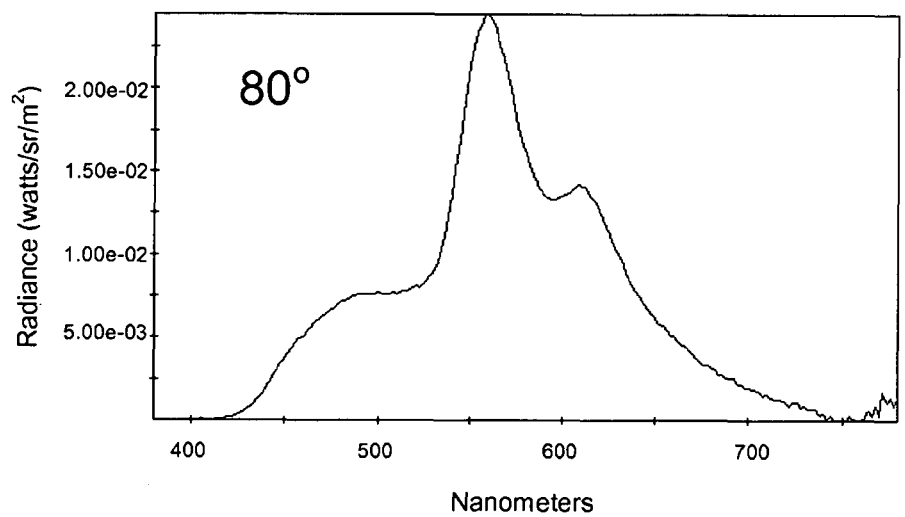

A series of devices were prepared with the same structure as Device A except that they had no light-scattering layer. Instead, varying thicknesses (0 nm, 20 nm, 40 nm, 60 nm, 80 nm, and 100 nm) of the enhancement layer 150 (SnO₂) were provided. The results are shown in FIG. 2. It was found that with an enhancement layer having a thickness of about 80 nm, the highest power efficiency enhancement, a factor of 2.7, was achieved. In addition, at 1000 nits, the power efficiency was enhanced to 34.9 lm/w. The color of the device was high white, the CIE was (0.48, 0.41) and showed high viewing angle dependence. FIG. 3 shows the electroluminescence (EL) spectrum without a light-scattering layer at viewing angle of (a) 0 and (b) 80°.

Figure 4A:
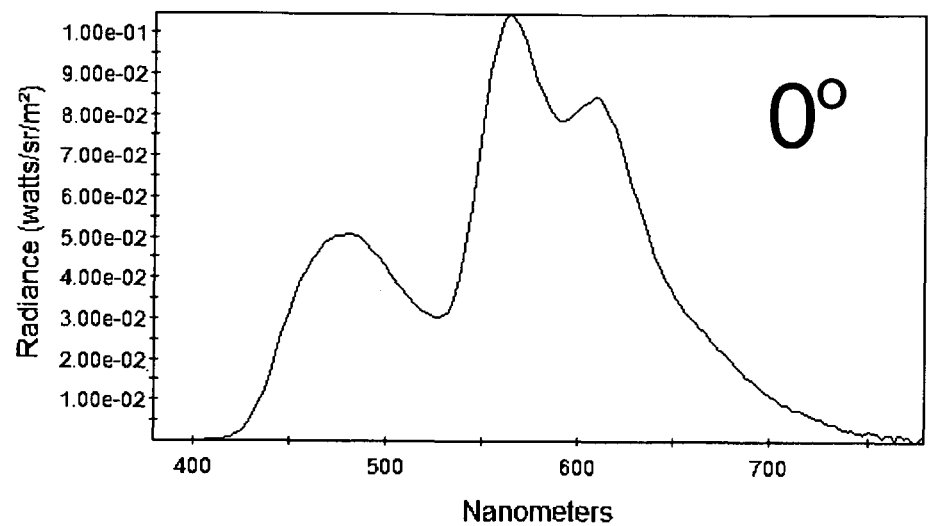
FIG. 4A and FIG. 4B are plots of the electroluminescence spectrum vs. viewing angle of an embodiment of a light-emitting device.
Figure 4B:
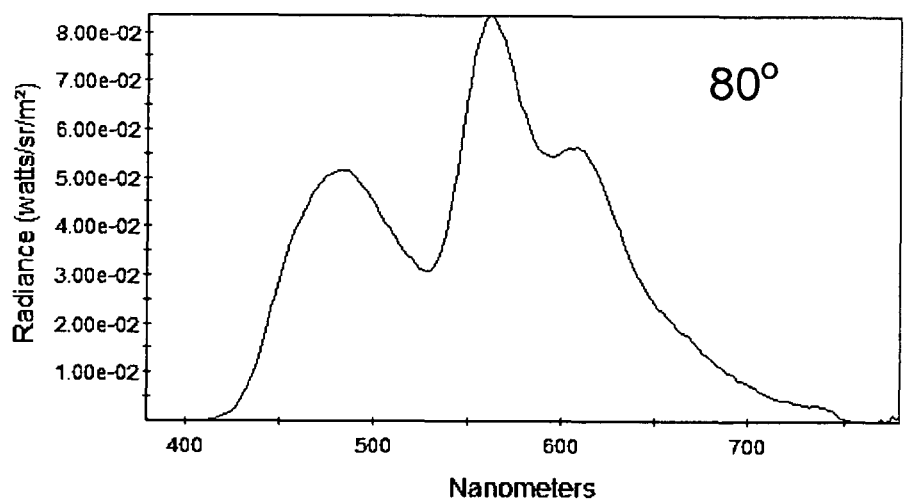

Device A, with the light-scattering layer, showed white color and very small viewing angle dependence. The EL spectrum and the lighting image of Device A are depicted in FIG. 4 at a viewing angle of (a) 0 and (b) 80°.

Figure 5:
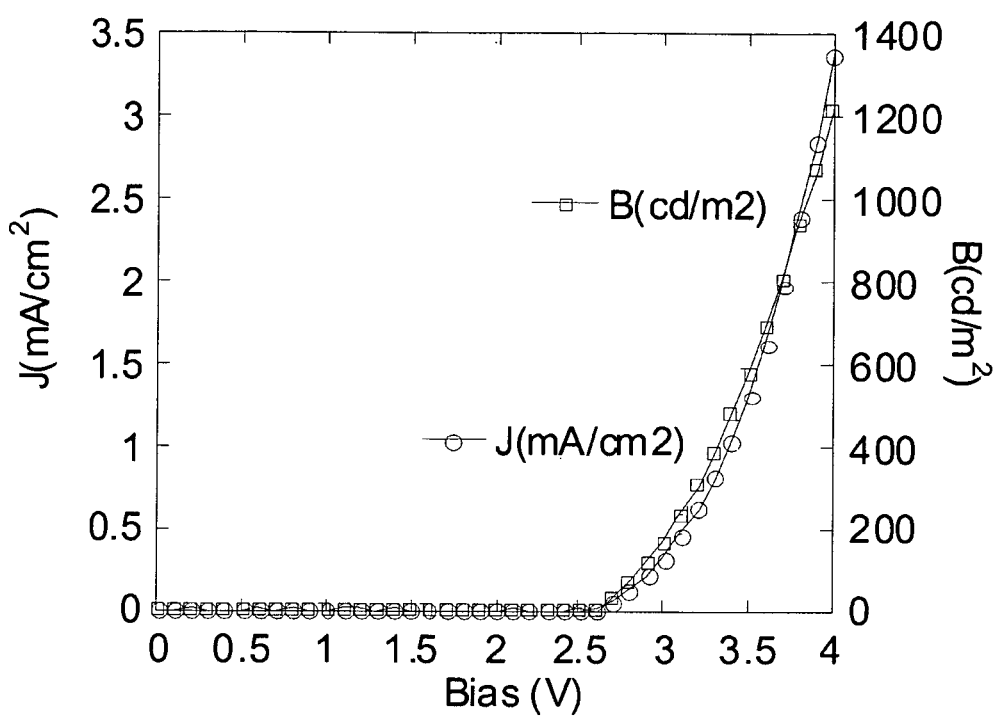
FIG. 5 is a plot of current density (mA/cm$^2$) and brightness (cd/m$^2$) as a function of driving voltage of an embodiment of a light-emitting device.
Figure 6:
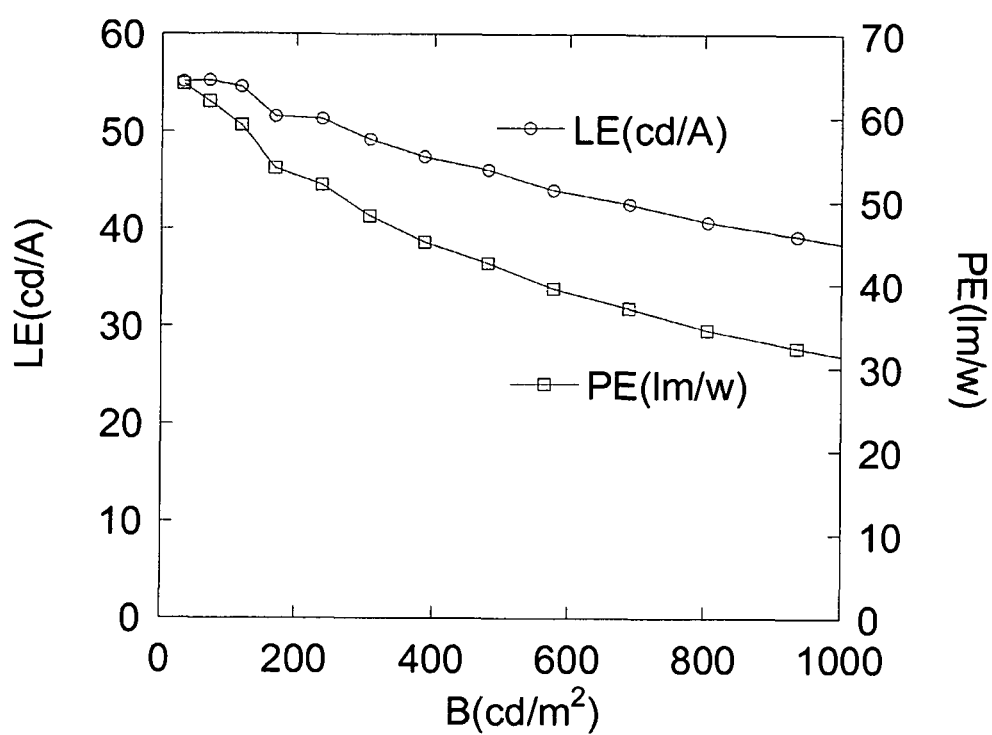
FIG. 6 is a plot of power efficiency (PE) and luminance efficiency (LE) as a function of device brightness of an embodiment of a light-emitting device.

The EL spectrum of Device A were similar at different viewing angles with a CIE of (0.41, 0.40) at 0° and (0.39, 0.41) at 80°. FIG. 5 is a plot of current density (mA/cm2) and brightness (cd/m2) as a function of driving voltage of Device A. The device shows a low turn-on voltage of 2.5V. FIG. 6 is a plot of power efficiency (PE) and luminance efficiency (LE) as a function of device brightness of Device A. Device A has a high power efficiency (30 lm/w) at 1000 nit with working voltage of 3.9V (FIG. 6). Device A also has a CRI greater than about 75.

Example 2

Pre-cleaned ITO glass substrates were baked at about 200° C. for about 1 hour under an ambient environment, then under UV-ozone treatment for about 30 minutes. Then, a PEDOT layer (about 30 nm thick) was spin-coated on top of the substrates' surface at 6000 RPM for about 40 seconds to smooth the surface. Then the substrates were baked at about 180° C. for about 1 hour. The substrates were then loaded into a deposition chamber.

A bi-layer reflective bottom anode, (60 nm Al layer first and then a 10 nm Ag layer) were deposited sequentially at a rate of about 2 Å/s. Molybdenum oxide ($MoO_3$, about 20 nm) was deposited as a hole-injecting layer at deposition rate of about 1 Å/s. Then a p-doping layer (10 nm), $MoO_3$, was co-deposited with 4,4'-bis[N-(naphthyl)-N-phenyl-amino]biphenyl (NPB) at 5% in volume ratio at the deposition rate of about 0.05 and about 1 Å/s for $MoO_3$ and NPB, respectively. A layer of NPB (about 10 nm) was then deposited as a hole-transport layer, followed by the deposition of the fluorescent blue emissive layer (18 nm), fluorescent blue (BE-1) neat layer was deposited at 1 Å/s.

This was followed by the three co-deposition of phosphorescent emissive layer (5 nm), which comprised a red phosphorescent emitter ($Ir(piq)_2acac$) at 0.5% volume concentration, and a yellow phosphorescent emitter (YE-1) at 5% volume concentration, and a host (BE-1). Then, another fluorescent blue emissive neat layer (18 nm, BE-1) was deposited. The electron transporting layer (35 nm) of 1,3,5-Tris(1-phenyl-1H-benzimidazol-)2-yl)benzene (TPBI) was deposited on top of the upper fluorescent blue emissive layer at about 1 Å/s. The semitransparent cathode, which comprised bi-layer metals of Ca and Au, was added. The first 4 nm of thickness was Ca deposited on top of the TPBI layer, followed by the deposition a 12 nm thick Au layer to finish the cathode deposition.

The light enhancement layer ($SnO_2$, 80 nm) was deposited on top of the cathode to enhance the light output, followed by the deposition of light scattering layer (3,5-bis (3-(benzo[d]oxazol-2-yl)phenyl)pyridine) at about 1 Å/s to a thickness of about 900 nm to complete the device fabrication. All the deposition was done in high vacuum of about $3\times10^{-7}$ torr.

Although the subject matter of the claims have been disclosed in the context of certain embodiments and examples, it will be understood by those skilled in the art that the scope of the claims extends beyond the specifically disclosed embodiments to other alternative embodiments and/or uses of the invention and obvious modifications and equivalents thereof. Thus, it is intended that the scope of the present claims should not be limited by the particular disclosed embodiments described above.

The invention claimed is:

1. A light-emitting device comprising:
a substrate;
a reflective anode over the substrate;
a hole-injection layer over the reflective anode;
a hole-transport layer over the hole-injection layer;
an emissive component over the hole-transport layer, wherein the emissive component comprises:
  a first fluorescent light-emitting layer;
  a second fluorescent light-emitting layer; and
  an intervening phosphorescent light-emitting layer disposed between the first fluorescent light-emitting layer and the second fluorescent light-emitting layer;
or wherein the emissive component comprises:
  a first phosphorescent light-emitting layer;
  a second phosphorescent light-emitting layer; and
  an intervening fluorescent light-emitting layer disposed between the first phosphorescent light-emitting layer and the second phosphorescent light-emitting layer; an electron-transport layer over the emissive component;
a semi-transparent or transparent cathode over the electron-transport layer;
an enhancement layer over the semi-transparent or transparent cathode; and
a light-scattering layer over the enhancement layer;
wherein the first fluorescent light-emitting layer, the second fluorescent light-emitting layer, and the intervening fluorescent light-emitting layer each comprises a fluorescent ambipolar host material selected from the group consisting of:

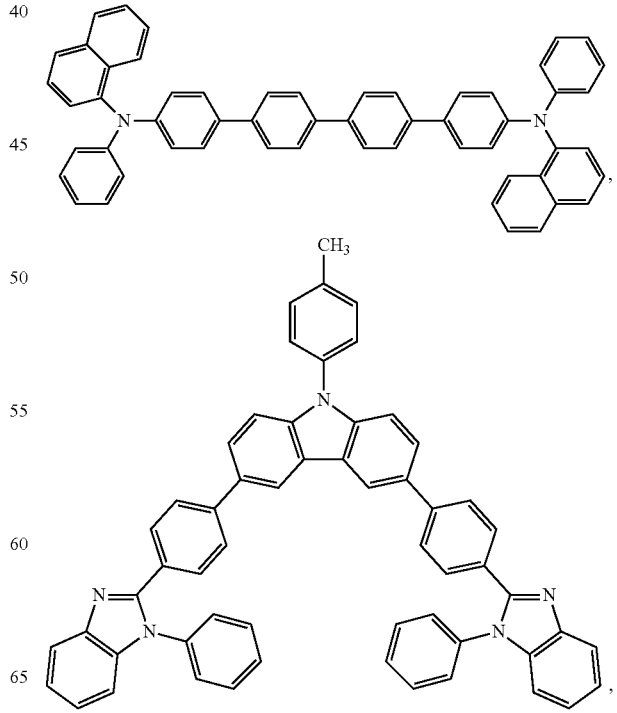

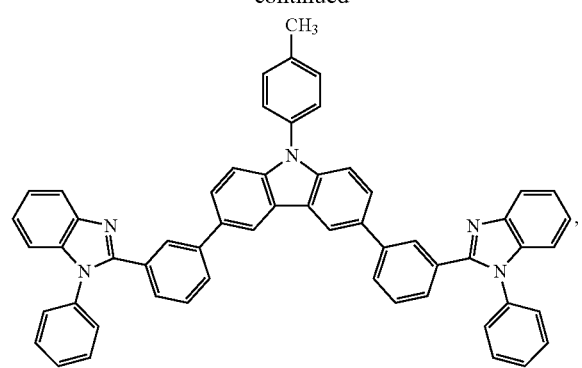
,
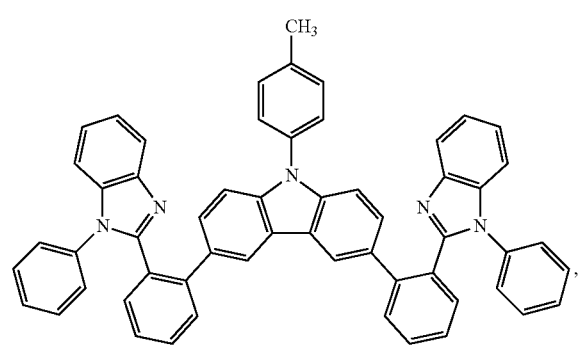
,
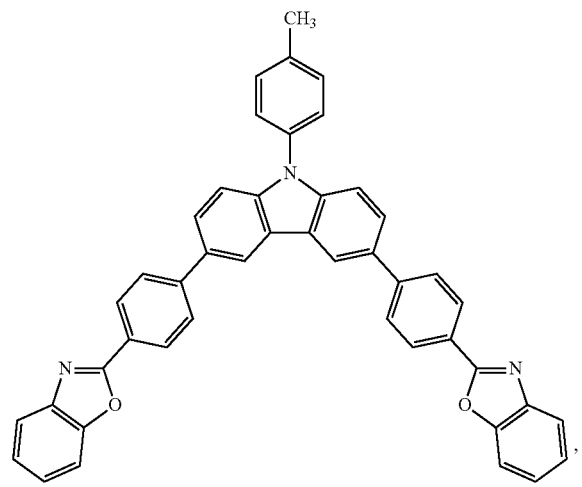
,
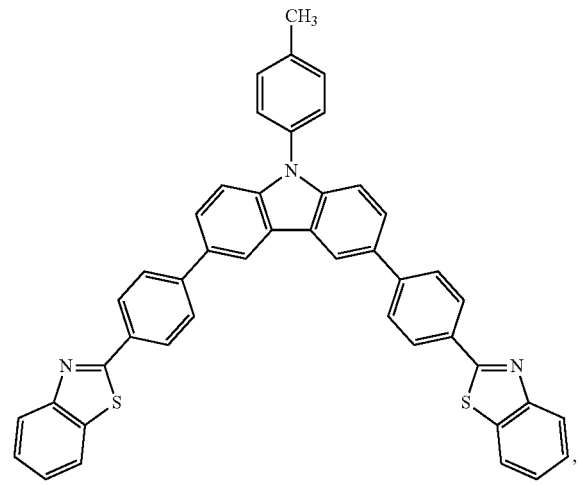
,
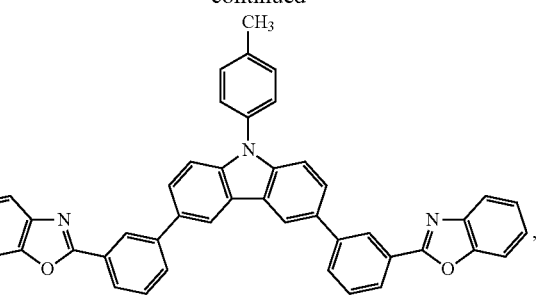
,
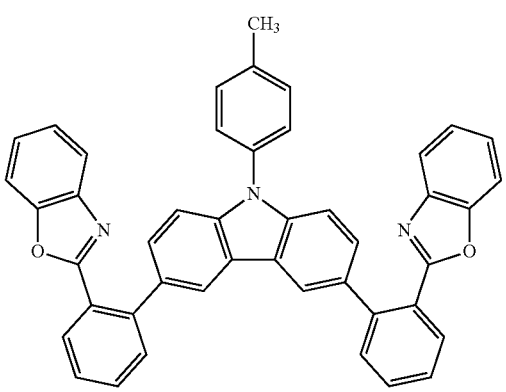
,
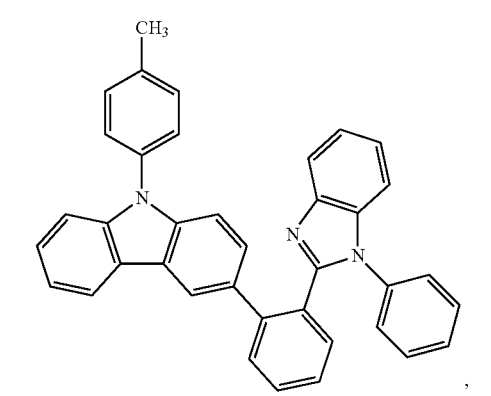
,
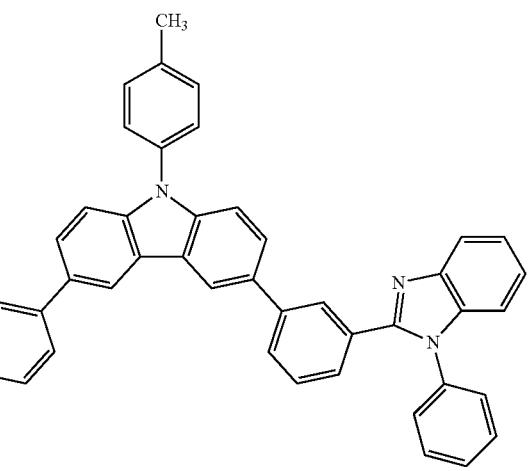
,

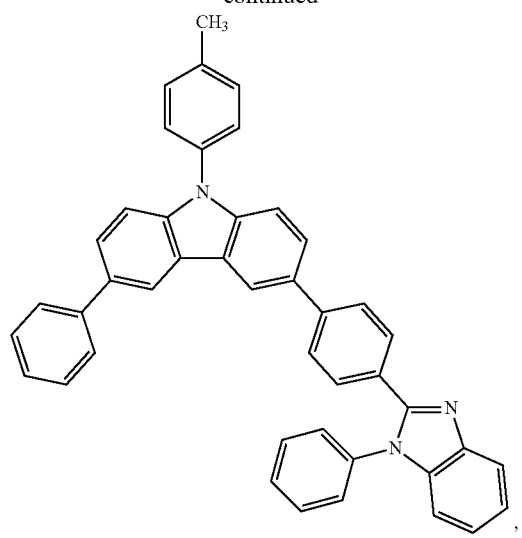
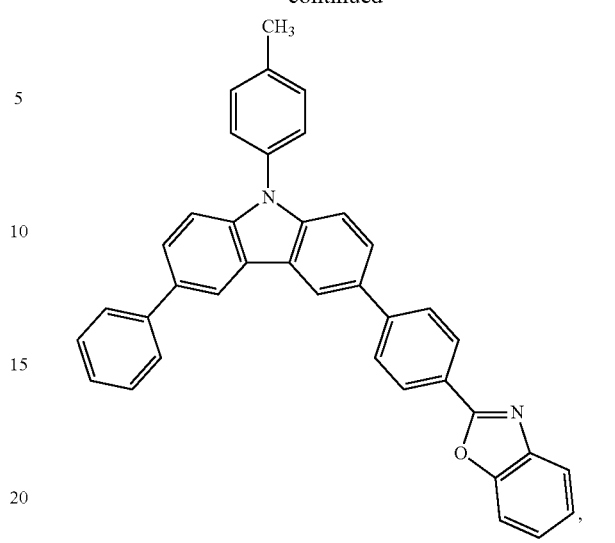
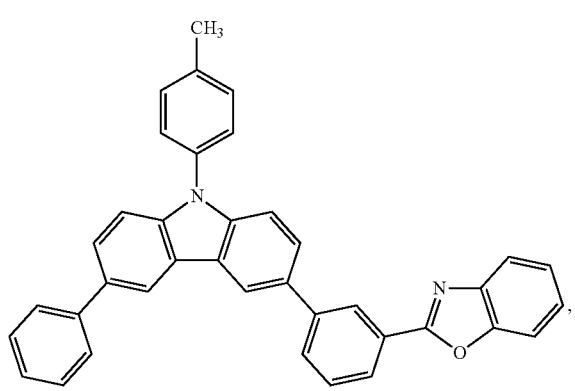
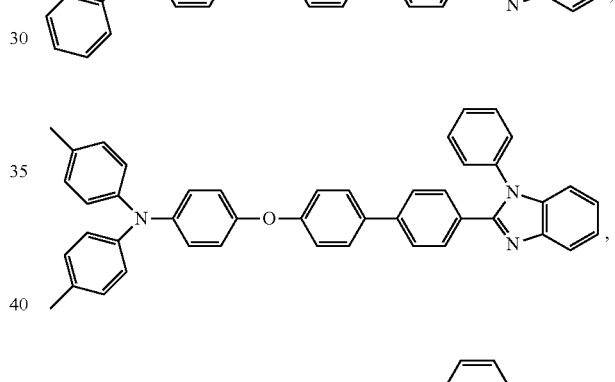
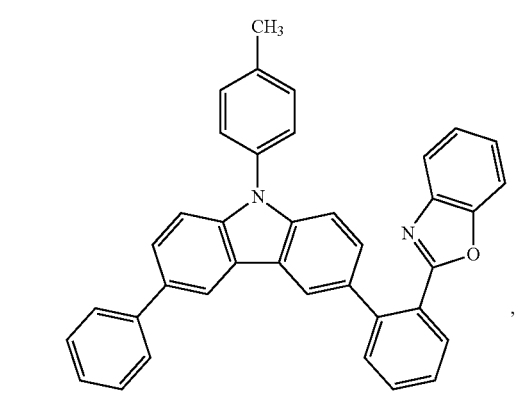
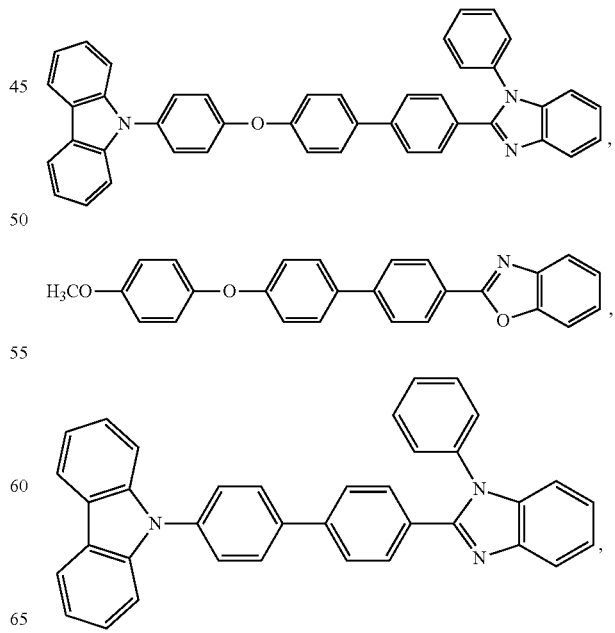

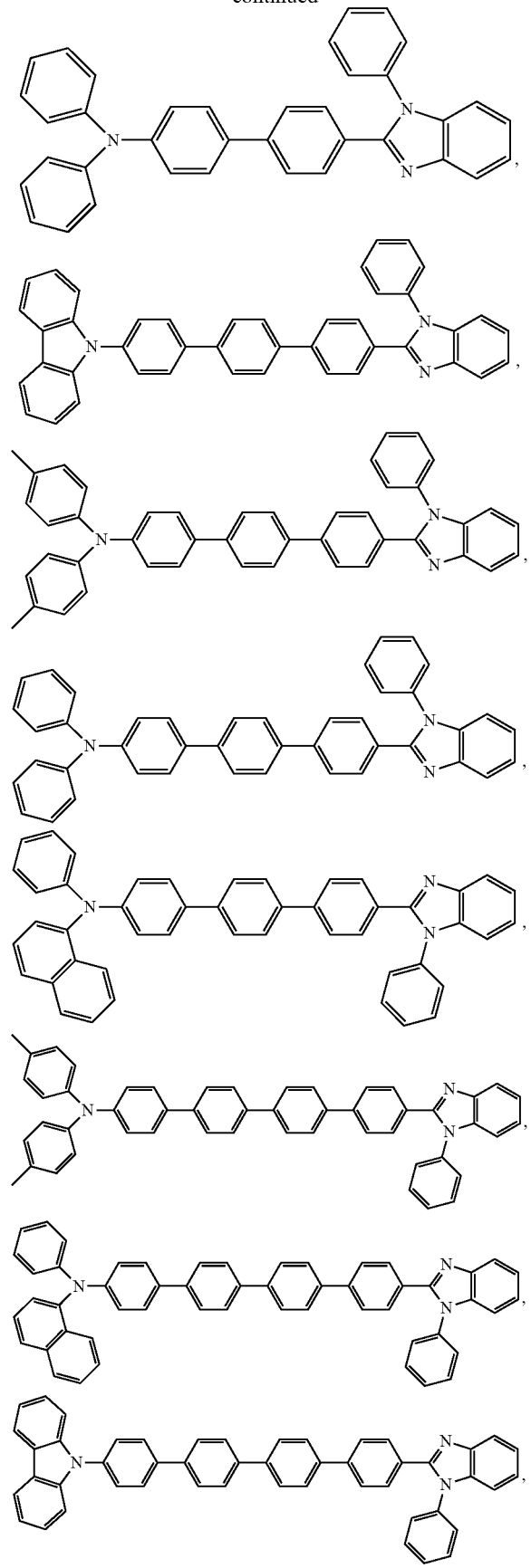

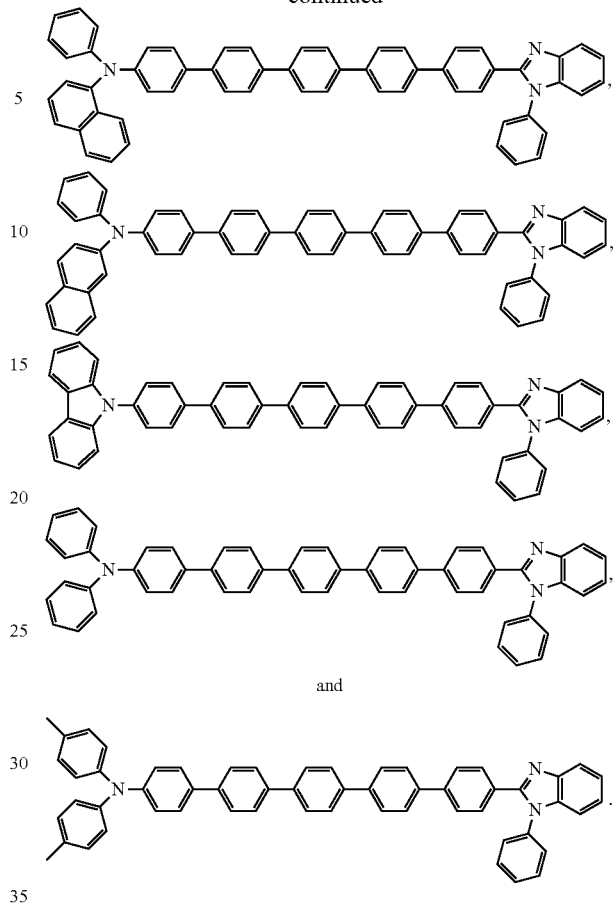

2. The light-emitting device of claim 1, wherein the reflective anode comprises a first anode sublayer and a second anode sublayer, wherein the first anode sublayer comprises a material selected from the group consisting of Al, Ag, Ni, and combinations thereof, and wherein the second anode sublayer comprises a material selected from the group consisting of Ag, Al, Au, and combinations thereof.

3. The light-emitting device of claim 1, wherein the hole-injection layer comprises a high work function material.

4. The light-emitting device of claim 1, wherein the hole-transport layer comprises 4,4'-bis[N-(naphthyl)-N-phenyl-amino]biphenyl.

5. The light-emitting device of claim 4, wherein the hole-transport layer further comprises a $MoO_3$ dopant.

6. The light-emitting device of claim 1, wherein the hole-transport layer comprises:
   a first hole-transport sublayer comprising 4,4'-bis[N-(naphthyl)-N-phenyl-amino]biphenyl and a dopant, wherein the dopant is $MoO_3$; and
   a second hole-transport sublayer comprising 4,4'-bis[N-(naphthyl)-N-phenyl-amino]biphenyl, wherein the second hole-transport sublayer is substantially free of $MoO_3$.

7. The light-emitting device of claim 1, wherein the fluorescent ambipolar host material has a peak emission in the range of about 430 nm to about 500 nm.

8. The light-emitting device of claim 1, wherein the first phosphorescent light-emitting layer and the second phosphorescent light-emitting layer each comprises a host and a phosphorescent dopant material, or the intervening phosphorescent light-emitting layer comprises the host and the phosphorescent dopant material, wherein the phosphorescent dopant material has a peak emission in the range of about 570 nm to about 650 nm.

9. The light-emitting device of claim 1, wherein the first phosphorescent light-emitting layer and the second phosphorescent light-emitting layer each comprises a host, or the intervening phosphorescent light-emitting layer comprises the host, wherein the host comprises:

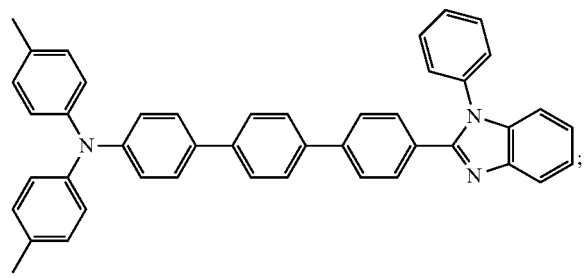 [SMILES: Cc1ccc(N(c2ccc(C)cc2)c2ccc(-c3ccc(-c4ccc(-c5nc6ccccc6n5-c5ccccc5)cc4)cc3)cc2)cc1]

about 5% by weight, based on the weight of the phosphorescent light-emitting layer, of the following compound:

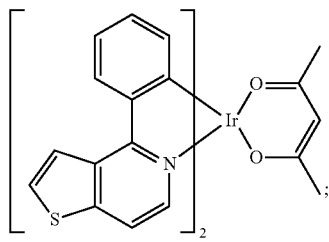

and about 0.5% by weight of Ir(piq)2acac, based on the weight of the phosphorescent light-emitting layer.

10. The light-emitting device of claim 1, wherein the first phosphorescent light-emitting layer and the second phosphorescent light-emitting layer each comprises two phosphorescent emitters, or the intervening phosphorescent light-emitting layer comprises two phosphorescent emitters, wherein each phosphorescent emitter emits visible light having a peak emission in the red to green range.

11. The light-emitting device of claim 1, wherein the electron-transport layer comprises 1,3,5-tris[2-N-phenyl-benzimidazol-z-yl]benzene.

12. The light-emitting device of claim 1, wherein the semi-transparent or transparent cathode comprises a first cathode sublayer comprising materials selected from Mg, Ca, Mg/Ag, LiF/Al, CsF, CsF/Al or alloys thereof and a second cathode sublayer comprising materials selected from Al, Ag, Au, Cu, Mg/Ag, or alloys thereof.

13. The light-emitting device of claim 1, wherein the enhancement layer comprises a visible light substantially transparent material having refractive index higher than about 1.5.

14. The light-emitting device of claim 1, wherein the light-scattering layer comprises one or more of the compounds, each selected from the group consisting of:

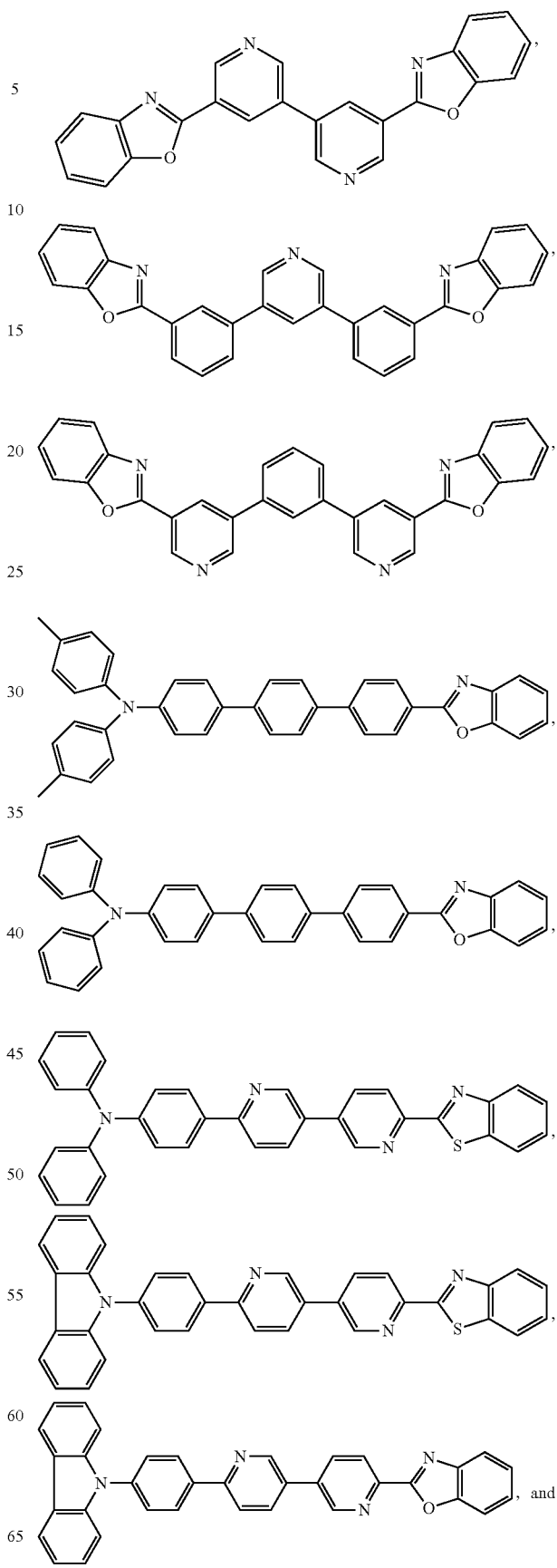

-continued

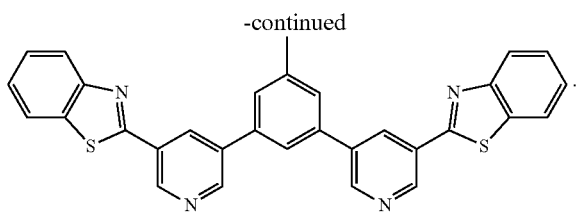

15. The light-emitting device of claim 1, wherein the light-scattering layer comprises voids having a volume that is at least about 50% of the volume of the light-scattering layer.

16. The light-emitting device of claim 1, wherein the light-scattering layer has a thickness in the range of about 0.1 μm to about 10 μm.

17. The light-emitting claim 1, wherein at least a portion of the first fluorescent light-emitting layer and at least a portion of the intervening phosphorescent light-emitting layer directly contact one another.

18. The light-emitting device claim 17, wherein at least a portion of the second fluorescent light-emitting layer and at least a portion of the intervening phosphorescent light-emitting layer directly contact one another.

19. The light-emitting device claim 1, wherein at least a portion of the first phosphorescent light-emitting layer and at least a portion of the intervening fluorescent light-emitting layer directly contact one another.

20. The light-emitting device claim 19, wherein at least a portion of the second phosphorescent light-emitting layer and at least a portion of the intervening fluorescent light-emitting layer directly contact one another.

21. The light-emitting device of claim 1, wherein:
the first fluorescent light-emitting layer is undoped;
the intervening phosphorescent light-emitting layer comprises a fluorescent host material of the first fluorescent light-emitting layer; and
the second fluorescent light-emitting layer is undoped, or the second fluorescent light-emitting layer comprises the fluorescent host material of the first fluorescent light-emitting layer.

* * * * *